(12) United States Patent
Imai et al.

(10) Patent No.: US 12,531,525 B2
(45) Date of Patent: Jan. 20, 2026

(54) POWER AMPLIFIER CIRCUIT

(71) Applicant: Murata Manufacturing Co., Ltd., Kyoto (JP)

(72) Inventors: Shohei Imai, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 454 days.

(21) Appl. No.: 18/174,277

(22) Filed: Feb. 24, 2023

(65) Prior Publication Data
US 2023/0216456 A1 Jul. 6, 2023

Related U.S. Application Data

(63) Continuation of application No. PCT/JP2021/031455, filed on Aug. 27, 2021.

(30) Foreign Application Priority Data

Aug. 27, 2020 (JP) ................. 2020-143475

(51) Int. Cl.
*H03F 3/21* (2006.01)
*H03F 1/56* (2006.01)
*H03F 3/213* (2006.01)

(52) U.S. Cl.
CPC ............. *H03F 3/211* (2013.01); *H03F 1/565* (2013.01); *H03F 3/213* (2013.01)

(58) Field of Classification Search
CPC ........... H03F 3/211; H03F 1/565; H03F 3/213
USPC ............................................ 330/124 R, 295
See application file for complete search history.

(56) References Cited

U.S. PATENT DOCUMENTS

| 2010/0045385 | A1* | 2/2010 | Pengelly ................. H03F 3/604 330/124 R |
| 2014/0160693 | A1 | 6/2014 | Maruyama |
| 2019/0068143 | A1* | 2/2019 | Choi ..................... H03F 1/0205 |
| 2019/0165739 | A1 | 5/2019 | Lyalin et al. |
| 2019/0173430 | A1* | 6/2019 | Krehbiel ............... H03F 1/0288 |
| 2019/0379334 | A1* | 12/2019 | Krvavac ................... H01P 3/08 |

(Continued)

FOREIGN PATENT DOCUMENTS

JP 2014-116844 A 6/2014

OTHER PUBLICATIONS

Zhao et al., "Analysis and Design of CMOS Doherty Power Amplifier Based on Voltage Combining Method", Apr. 24, 2017, IEEE Access, Digital Object Identifier 10.1109/Access.2017. 2678678. (Year: 2017).*

(Continued)

*Primary Examiner* — Hafizur Rahman
(74) *Attorney, Agent, or Firm* — McDonald Hopkins LLC

(57) ABSTRACT

A power amplifier circuit includes a power splitter, a first amplifier, a second amplifier, a third amplifier, a fourth amplifier, a first bias circuit, a first line connecting the first bias circuit and the first amplifier, and a second line connecting the first bias circuit and the third amplifier on the same semiconductor substrate, in which the first line and the second line are formed such that a voltage drop amount of the first bias voltage between the first bias circuit and the first amplifier is substantially equal to a voltage drop amount of the first bias voltage between the first bias circuit and the third amplifier.

20 Claims, 13 Drawing Sheets

(56) References Cited

U.S. PATENT DOCUMENTS

2020/0083848 A1* 3/2020 Zhou .................... H03F 3/3001
2021/0050820 A1* 2/2021 Khalil ................... H03F 3/607

OTHER PUBLICATIONS

Jee et al., "Highly Linear 2-Stage Doherty Power Amplifier Using GaN MMIC", Journal of Electromagnetic Engineering and Science, vol. 14, No. 4, 399~404, Dec. 2014. (Year: 2014).*
International Search Report for PCT/JP2021/031455 dated Nov. 22, 2021.

* cited by examiner

POWER AMPLIFIER CIRCUIT

CROSS REFERENCE TO RELATED APPLICATION

This is a continuation of International Application No. PCT/JP2021/031455 filed on Aug. 27, 2021 which claims priority from Japanese Patent Application No. 2020-143475 filed on Aug. 27, 2020. The contents of these applications are incorporated herein by reference in their entireties.

BACKGROUND ART

Technical Field

The present disclosure relates to a power amplifier circuit.

A Doherty amplifier is a high-efficiency power amplifier. In the Doherty amplifier, in general, a carrier amplifier that operates regardless of the power level of an input signal and a peak amplifier that is turned off when the power level of the input signal is low and turned on when the power level of the input signal is high are connected in parallel. When the power level of the input signal is high, the carrier amplifier operates while maintaining saturation at the saturation output power level. That is, in the back-off state in which only the carrier amplifier performs the amplifying operation, since only the carrier amplifier operates, the peak amplifier does not consume an unnecessary current and the efficiency is increased. In the differential Doherty amplifier in which the Doherty amplifiers are combined, when signals (for example, noise or the like) having the same amplitude and the same phase are simultaneously input to each of the two amplifying elements, the signals having the same amplitude and the same phase can be canceled. This makes it possible to suppress generation of noise and a harmonic wave of an input signal in the power amplifier circuit (see, for example, Patent Document 1).

Patent Document 1: US 2019/0165739 A1

BRIEF SUMMARY

A differential power amplifier circuit described in Patent Document 1 includes a carrier bias circuit that supplies a bias to two carrier amplifiers and a peak bias circuit that supplies a bias to two peak amplifiers. In the power amplifier circuit, components are arranged on a semiconductor substrate such that a wiring length between the carrier bias circuit and one of the carrier amplifiers is different from a wiring length between the carrier bias circuit and the other carrier amplifier due to a space on the semiconductor substrate. Thus, in the power amplifier circuit, a voltage drop amount of the line from the carrier bias circuit to the one carrier amplifier is different from a voltage drop amount of the line from the carrier bias circuit to the other carrier amplifier. The same applies to the wiring length between the peak bias circuit and each peak amplifier. Therefore, in the power amplifier circuit, a difference occurs in the bias point between the two carrier amplifiers or between the two peak amplifiers, so that the performance of each amplifier cannot be sufficiently exhibited and the efficiency thereof may be lowered.

The present disclosure provides an efficient power amplifier circuit including a differential Doherty amplifier.

A power amplifier circuit according to an aspect of the present disclosure includes a power splitter configured to split an input signal into a first signal and a second signal different in phase from the first signal, a first amplifier configured to amplify a first branch signal branched from the first signal and output a first amplified signal, a second amplifier configured to amplify, when a power level of a second branch signal branched from the first signal is equal to or higher than a predetermined power level, the second branch signal and output a second amplified signal, a third amplifier configured to amplify a third branch signal branched from the second signal and output a third amplified signal, a fourth amplifier configured to amplify, when a power level of a fourth branch signal branched from the second signal is equal to or higher than a predetermined power level, the fourth branch signal and output a fourth amplified signal, a first bias circuit configured to output a first bias voltage, a first line having a first length and connecting the first bias circuit and the first amplifier and a second line having a second length shorter than the first length and connecting the first bias circuit and the third amplifier, on the same semiconductor substrate, in which the first line and the second line are formed such that a voltage drop amount of the first bias voltage between the first bias circuit and the first amplifier is substantially equal to a voltage drop amount of the first bias voltage between the first bias circuit and the third amplifier.

According to the present disclosure, it is possible to provide an efficient power amplifier circuit including a differential Doherty amplifier.

DETAILED DESCRIPTION

===Structure of Power Amplifier Circuit 100===

A power amplifier circuit 100 is mounted on, for example, a mobile phone and is used to amplify the power of a signal to be transmitted to a base station. The power amplifier circuit 100 can amplify the power of a signal of a communication standard, such as 2G (second generation mobile communication system), 3G (third generation mobile communication system), 4G (fourth generation mobile communication system), 5G (fifth generation mobile communication system), LTE (Long Term Evolution)-FDD (Frequency Division Duplex), LTE-TDD (Time Division Duplex), LTE-Advanced, LTE-Advanced Pro, or 6G (sixth generation mobile communication system). Note that the communication standard of the signal amplified by the power amplifier circuit 100 is not limited to these.

The power amplifier circuit 100 amplifies an input signal RFin and outputs an output signal RFout. The input signal is a radio-frequency (RF) signal, and the frequency of the input signal is, for example, about several GHz to several tens of GHz.

Figure 1:
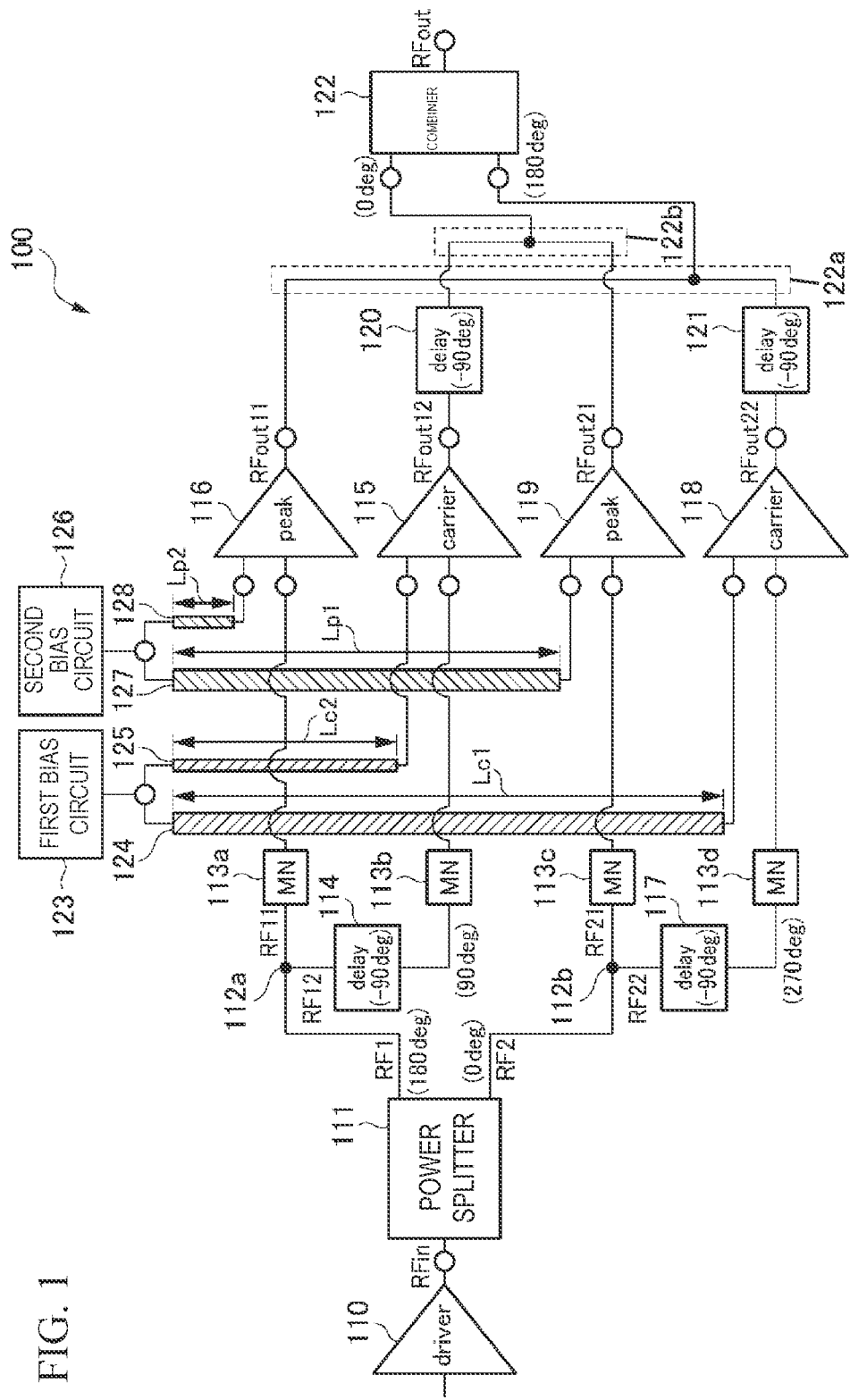
FIG. 1 is a configuration diagram illustrating an example of a configuration of a power amplifier circuit.

A configuration of the power amplifier circuit 100 will be described with reference to FIG. 1. FIG. 1 is a configuration diagram illustrating an example of the configuration of the power amplifier circuit 100. As illustrated in FIG. 1, the power amplifier circuit 100 includes, for example, a drive stage amplifier 110, a power splitter 111, a matching network 113 (113a to 113d), a first phase shifter 114, a first carrier amplifier 115, a first peak amplifier 116, a second phase shifter 117, a second carrier amplifier 118, a second peak amplifier 119, a third phase shifter 120, a fourth phase shifter 121, a combiner 122, a first bias circuit 123, a carrier long line 124, a carrier short line 125, a second bias circuit 126, a peak long line 127, and a peak short line 128. The components included in the power amplifier circuit 100 are formed on the same semiconductor substrate.

For example, the drive stage amplifier 110 amplifies the input RF signal and outputs the amplified signal. In the present embodiment, the output amplified signal is referred to as a "signal RFin". The frequency of the signal RFin is, for example, about several GHz. Although not particularly limited, the drive stage amplifier 110 is configured by, for example, a bipolar transistor such as a heterojunction bipolar transistor (HBT) or a transistor such as a field effect transistor (MOSFET: metal-oxide-semiconductor field-effect transistor). Note that the same applies to the first carrier amplifier 115, the first peak amplifier 116, the second carrier amplifier 118, and the second peak amplifier 119, which will be described later.

The power splitter 111 is, for example, a balun, and splits the input amplified signal RFin into a signal RF1 and a signal RF2 whose phase is delayed (inverted) by approximately 180 degrees with respect to the signal RF1. The signal RF1 is branched into a branch signal RF11 and a branch signal RF12 in a branch portion 112a. The branch signal RF11 is input to the first peak amplifier 116 through the matching network 113a to be described later. The branch signal RF12 is input to the first carrier amplifier 115 through the first phase shifter 114 and the matching network 113b, which will be described later. Further, the signal RF2 is branched into a branch signal RF21 and a branch signal RF22 in a branch portion 112b. The branch signal RF21 is input to the second peak amplifier 119 through the matching network 113c to be described later. The branch signal RF22 is input to the second carrier amplifier 118 through the second phase shifter 117 and the matching network 113d, which will be described later. Note that in the present disclosure, the meaning of "delayed by approximately 180 degrees" includes an adjustment range of plus or minus 45 degrees.

As described above, in the power amplifier circuit 100, the branch signal RF12 input to the first carrier amplifier 115 and the branch signal RF22 input to the second carrier amplifier 118 have a phase difference of approximately 180 degrees. In the power amplifier circuit 100, the branch signal RF11 input to the first peak amplifier 116 and the branch signal RF21 input to the second peak amplifier 119 are substantially 180 degrees out of phase with each other. That is, the power amplifier circuit 100 forms a differential amplifier circuit.

Note that although the description has been made in which the power splitter 111 splits the amplified signal RFin into two signals having a phase difference of approximately 180 degrees, the present disclosure is not limited thereto. For example, the power splitter 111 may split the signal into two signals having an arbitrary phase difference in the range of 135 degrees to 225 degrees. The configuration of the power splitter 111 will be described later.

Each matching network (MN) 113 matches the impedance of each of the amplifiers 115, 116, 118, and 119 with the impedance of the power splitter 111. The matching network 113 includes, for example, an inductor and a capacitor. Note that the power amplifier circuit 100 need not include all or a part of the matching network 113. In addition, the power amplifier circuit 100 may include an amplifier instead of the matching network 113 or together with the matching network 113, for example.

The first phase shifter 114 is, for example, a phase shifter that is electrically connected between the power splitter 111 and the first carrier amplifier 115 and delays the phase of the branch signal RF12 by approximately 90 degrees. The first phase shifter 114 is, for example, a quarter-wavelength line, a distributed constant circuit, or the like. When the first phase shifter 114 is a distributed constant circuit (not illustrated), the first phase shifter 114 is configured to include, for example, a capacitor C1, an inductor L, and a capacitor C2. Here, one end of the capacitor C1 is connected to a terminal of the power splitter 111, for example. In addition, for example, one end of the inductor L is connected to the other end of the capacitor C1, and the other end of the inductor L is connected to the first carrier amplifier 115. In addition, for example, one end of the capacitor C2 is connected to a connection point between the capacitor C1 and the inductor L, and the other end of the capacitor C2 is connected to the ground. Thus, the distributed constant circuit can adjust the phase shift with respect to the signal by adjusting the constants of the capacitors C1 and C2 and the inductor L. Note that the meaning of "delayed by approximately 90 degrees" in the present disclosure includes an adjustment range of plus or minus 45 degrees.

For example, the first carrier amplifier 115 (third amplifier) amplifies the branch signal RF12 input through the first phase shifter 114 and outputs an amplified signal (hereinafter referred to as a "signal RFout12"). The first carrier amplifier 115 is biased to, for example, Class A, Class AB, or Class B. That is, the first carrier amplifier 115 amplifies the input signal and outputs the amplified signal regardless of the power level of the input signal such as small instantaneous input power.

For example, the first peak amplifier 116 (fourth amplifier) amplifies the input branch signal RF11 and outputs an amplified signal (hereinafter referred to as a "signal RFout11"). The first peak amplifier 116 is biased to, for example, Class C.

The second phase shifter 117 is, for example, a phase shifter that is electrically connected between the power splitter 111 and the second carrier amplifier 118 and delays the phase of the branch signal RF22 by approximately 90 degrees. The second phase shifter 117 is, for example, a quarter-wavelength line, a distributed constant circuit, or the like.

For example, the second carrier amplifier 118 (first amplifier) amplifies the branch signal RF22 input through the second phase shifter 117 and outputs an amplified signal (hereinafter referred to as a "signal RFout22"). The second carrier amplifier 118 is biased to, for example, Class A, Class AB, or Class B. That is, the second carrier amplifier 118 amplifies the input signal and outputs the amplified signal regardless of the power level of the input signal, such as small instantaneous input power.

For example, the second peak amplifier 119 (second amplifier) amplifies the input branch signal RF21 and outputs an amplified signal (hereinafter referred to as a "signal RFout21"). The second peak amplifier 119 is biased to, for example, Class C.

As described above, in the power amplifier circuit 100, the two carrier amplifiers 115 and 118 operating with a phase difference of 180 degrees and the two peak amplifiers 116 and 119 operating with a phase difference of 180 degrees form a differential amplifier circuit. The differential amplifier circuit includes a pair of two amplifying elements, and amplifies and outputs a potential difference between signals having the same amplitude and opposite phases input to each of the two amplifying elements. Therefore, when signals (for example, noise or the like) having the same amplitude and the same phase are simultaneously input to each of the two amplifying elements, the signals having the same amplitude and the same phase are canceled. Accordingly, in the power amplifier circuit 100, it is possible to suppress generation of noise and a harmonic wave of an input signal.

The third phase shifter 120 is, for example, a phase shifter that is electrically connected between the first carrier amplifier 115 and the combiner 122 and delays the phase of the signal RFout12 by approximately 90 degrees. Thus, the electrical length from the power splitter 111 to the combiner 122 through the first carrier amplifier 115 and the electrical length from the power splitter 111 to the combiner 122 through the second peak amplifier 119 are substantially the same. The third phase shifter 120 is, for example, a quarter-wavelength line or a distributed constant circuit.

The fourth phase shifter 121 is, for example, a phase shifter that is electrically connected between the second carrier amplifier 118 and the combiner 122 and delays the phase of the signal RFout22 by approximately 90 degrees. Thus, the electrical length from the power splitter 111 to the combiner 122 through the first peak amplifier 116 and the electrical length from the power splitter 111 to the combiner 122 through the second carrier amplifier 118 are substantially the same. The fourth phase shifter 121 is, for example, a quarter-wavelength line or a distributed constant circuit.

As described above, in the power amplifier circuit 100 according to the present embodiment, for example, the first carrier amplifier 115 and the second peak amplifier 119 form a Doherty amplifier circuit, and the second carrier amplifier 118 and the first peak amplifier 116 form a Doherty amplifier circuit. Thus, the first carrier amplifier 115 operates in a region where the power level is equal to or higher than zero regardless of the power level of the input signal RFin. The second peak amplifier 119 operates in a region in which the voltage level of the input signal RFin is equal to or higher than a level (predetermined power level) lower than the maximum level Vmax by a predetermined level. That is, by combining the operations of the two amplifiers according to the power level of the input signal, the region in which the first carrier amplifier 115 operates at the saturation output is widened. Therefore, the power efficiency of the power amplifier circuit 100 is improved. The second carrier amplifier 118 and the first peak amplifier 116 operate in the same manner.

For example, a signal (phase "0 deg") combined by a combining unit 122a that combines the signal RFout11 output from the first peak amplifier 116 and the signal RFout22 output from the second carrier amplifier 118 through the fourth phase shifter 121 is input to the combiner 122. In addition, for example, a signal (phase "180 deg") combined by a combining unit 122b that combines the signal RFout12 output from the first carrier amplifier 115 through the third phase shifter 120 and the signal RFout21 output from the second peak amplifier 119 is input to the combiner 122. The combiner 122 combines two signals whose phases are inverted and outputs a combined signal (hereinafter referred to as a "signal RFout").

The first bias circuit 123 is a circuit that applies a bias voltage to the first carrier amplifier 115 and the second carrier amplifier 118. The voltage value of the bias voltage is appropriately set in accordance with the characteristics of the first carrier amplifier 115, the second carrier amplifier 118, and the input signal. Note that the first bias circuit 123 may be a circuit that supplies a bias current instead of the bias voltage. In other words, the first bias circuit 123 is a base bias circuit or a gate bias circuit. In the following description, it is assumed that the first bias circuit 123 supplies the bias voltage, as an example.

The carrier long line 124 (first line) is a line that is made of a predetermined conductive material and connects the first bias circuit 123 and the second carrier amplifier 118. The predetermined conductive material is, for example, copper, gold, aluminum, or the like. The carrier long line 124 may be a pattern wiring formed on the semiconductor substrate or may be a wire, for example. Hereinafter, the length of the carrier long line 124 will be described as "Lc1".

The carrier short line 125 (second line) is made of, for example, the same conductive material as that of the carrier long line 124 and is a line that connects the first bias circuit 123 and the first carrier amplifier 115. Hereinafter, the length of the carrier short line 125 will be described as "Lc2".

The carrier long line 124 and the carrier short line 125 may, for example, not only directly connect the first bias circuit 123 and the first and second carrier amplifiers 115 and 118 to each other but also indirectly connect them to each other via another element or the like. The carrier long line 124 and the carrier short line 125 are formed such that a voltage drop amount of the bias voltage between the first bias circuit 123 and the first carrier amplifier 115 is substantially equal to a voltage drop amount of the bias voltage between the first bias circuit 123 and the second carrier amplifier 118. Note that the case where one voltage drop amount and the other voltage drop amount are "substantially equal to each other" includes, for example, a case where a difference between the one voltage drop amount and the other voltage drop amount is within 100 mV. Thus, since the bias points between the two carrier amplifiers can be made substantially the same, the efficiency of the power amplifier circuit 100 can be improved. The structures of the carrier long line 124 and the carrier short line 125 will be described in detail later.

The second bias circuit 126 is a circuit that applies a bias voltage to the first peak amplifier 116 and the second peak amplifier 119. The voltage value of the bias voltage is appropriately set in accordance with the characteristics of the first peak amplifier 116, the second peak amplifier 119, and the input signal. Note that the second bias circuit 126 may be a circuit that supplies a bias current instead of the bias voltage. In other words, the second bias circuit 126 is a base bias circuit or a gate bias circuit. In the following description, it is assumed that the second bias circuit 126 supplies the bias voltage as an example.

The peak long line 127 (third line) is a line that is made of a predetermined conductive material and connects the second bias circuit 126 and the second peak amplifier 119. The predetermined conductive material is, for example, copper, gold, aluminum, or the like. Hereinafter, the length of the peak long line 127 will be described as "Lp1".

The peak short line 128 (fourth line) is formed of, for example, the same conductive material as that of the peak long line 127, and is a line that connects the second bias circuit 126 and the first peak amplifier 116. Hereinafter, the length of the peak short line 128 will be described as "Lp2".

The peak long line 127 and the peak short line 128 may not only directly connect the second bias circuit 126 and the first and second peak amplifiers 116 and 119 but also indirectly connect them to each other via another element or the like. The peak long line 127 and the peak short line 128 are formed so that a voltage drop amount of the bias voltage between the second bias circuit 126 and the first peak amplifier 116 is substantially equal to a voltage drop amount of the bias voltage between the second bias circuit 126 and the second peak amplifier 119. Thus, since the bias points between the two peak amplifiers can be made substantially the same, the efficiency of the power amplifier circuit 100 can be improved. The structures of the peak long line 127 and the peak short line 128 will be described in detail later. Furthermore, not only the efficiency is improved, but also the power up and distortion characteristics of the output power can be improved.

«Structure for Adjusting Bias Point»

Figure 2:
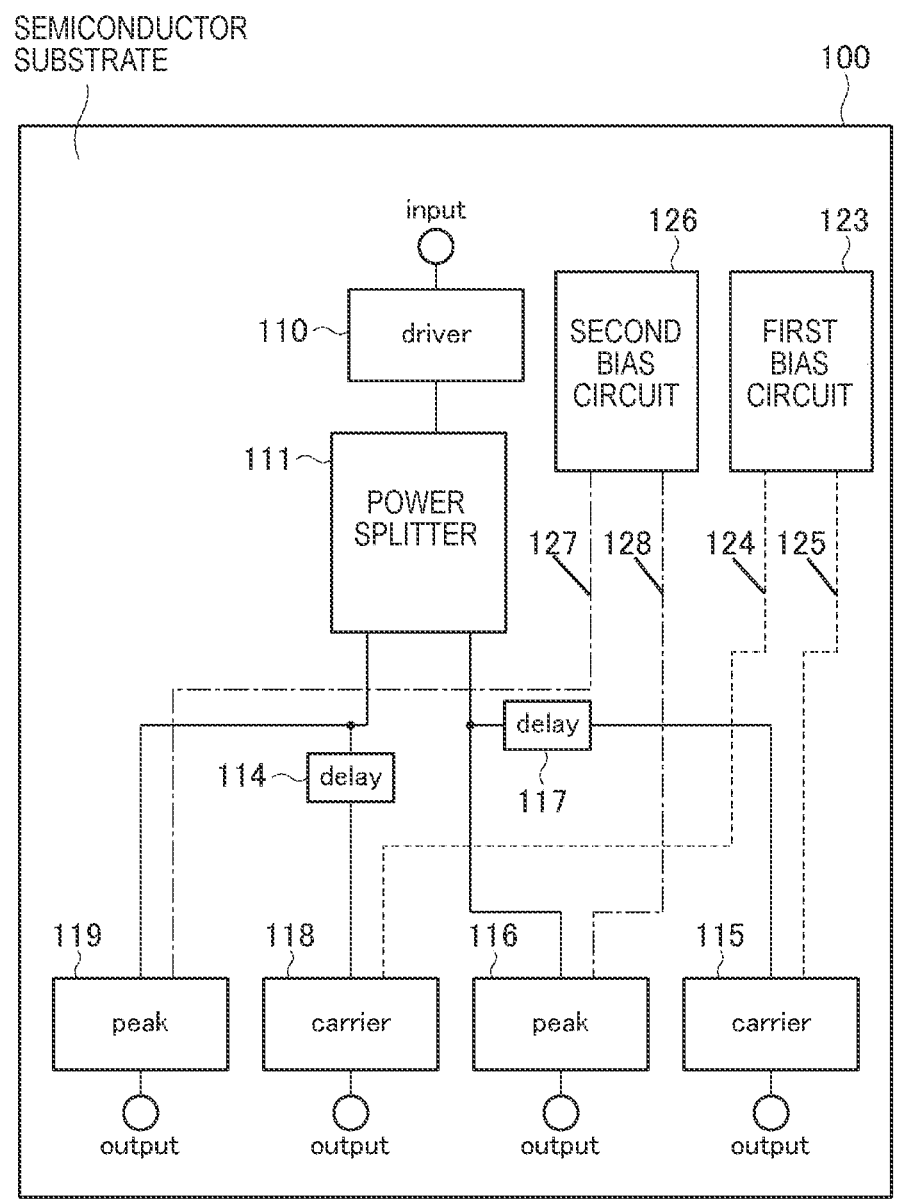
FIG. 2 is a diagram illustrating an arrangement of components of the power amplifier circuit on a semiconductor substrate.

A structure for adjusting the bias point of the power amplifier circuit 100 will be described with reference to FIG. 2. FIG. 2 is a diagram illustrating an arrangement of components of the power amplifier circuit 100 on the semiconductor substrate. Note that in FIG. 2, the configuration (the third phase shifter 120, the fourth phase shifter 121, and the combiner 122) on the output side of each amplifier is omitted.

In the power amplifier circuit 100, the first bias circuit 123 supplies a bias voltage to the second carrier amplifier 118 through the carrier long line 124. In addition, the first bias circuit 123 supplies a bias voltage to the first carrier amplifier 115 through the carrier short line 125. At this time, the bias point in the first carrier amplifier 115 is, for example, a voltage obtained by subtracting a voltage drop amount (hereinafter referred to as a carrier long voltage drop amount) between the first bias circuit 123 and the first carrier amplifier 115 from the bias voltage supplied from the first bias circuit 123. On the other hand, the bias point in the second carrier amplifier 118 is, for example, a voltage obtained by subtracting a voltage drop amount between the first bias circuit 123 and the second carrier amplifier 118 (hereinafter referred to as a carrier short voltage drop amount) from the bias voltage supplied from the first bias circuit 123.

The second bias circuit 126 supplies a bias voltage to the second peak amplifier 119 through the peak long line 127. In addition, the second bias circuit 126 supplies a bias voltage to the first peak amplifier 116 through the peak short line 128. At this time, the bias point in the first peak amplifier 116 is, for example, a voltage obtained by subtracting a voltage drop amount (hereinafter referred to as a peak long voltage drop amount) between the second bias circuit 126 and the second peak amplifier 119 from the bias voltage supplied from the second bias circuit 126. On the other hand, the bias point in the second peak amplifier 119 is, for example, a voltage obtained by subtracting a voltage drop amount between the second bias circuit 126 and the first peak amplifier 116 (hereinafter referred to as a peak short voltage drop amount) from the bias voltage supplied from the second bias circuit 126.

Here, when the bias point of the first carrier amplifier 115 and the bias point of the second carrier amplifier 118 indicate different voltages, the efficiency of the power amplifier circuit 100 decreases. In addition, when the bias point of the first peak amplifier 116 and the bias point of the second peak amplifier 119 indicate different voltages, the efficiency of the power amplifier circuit 100 decreases. That is, by making the bias point of the first carrier amplifier 115 and the bias point of the second carrier amplifier 118 substantially equal to each other and making the bias point of the first peak amplifier 116 and the bias point of the second peak amplifier 119 substantially equal to each other, the efficiency of the power amplifier circuit 100 can be improved.

However, as illustrated in FIG. 2, in the power amplifier circuit 100, the first carrier amplifier 115, the first peak amplifier 116, the second carrier amplifier 118, and the second peak amplifier 119 are arranged on the semiconductor substrate in a line in a certain direction. In this case, for example, in order to make the carrier long voltage drop amount and the carrier short voltage drop amount substantially equal to each other, it is necessary to arrange the first bias circuit 123 on a perpendicular bisector of a virtual line connecting the first carrier amplifier 115 and the second carrier amplifier 118. However, due to the arrangement of the components of the power amplifier circuit 100, the first bias circuit 123 cannot be arranged on the perpendicular bisector. Therefore, since the carrier long line 124 and the carrier short line 125 have different lengths, when the carrier long line 124 and the carrier short line 125 have the same cross-sectional area, the respective lines exhibit different resistance values. That is, the carrier long voltage drop amount and the carrier short voltage drop amount are not equal to each other. Similarly, for the peak long line 127 and the peak short line 128, when the peak long line 127 and the peak short line 128 have the same cross-sectional area, the peak long voltage drop amount and the peak short voltage drop amount are not equal to each other.

Therefore, in the power amplifier circuit 100, the shape of at least one of the carrier long line 124 and the carrier short line 125 is adjusted so that the carrier long voltage drop amount and the carrier short voltage drop amount are substantially equal to each other. Similarly, in the power amplifier circuit 100, the shape of at least one of the peak long line 127 and the peak short line 128 is adjusted so that the peak long voltage drop amount and the peak short voltage drop amount are substantially equal to each other.

Further, in the power amplifier circuit 100, a resistor may be connected in series with the carrier short line 125 so that the carrier long voltage drop amount and the carrier short voltage drop amount are substantially equal to each other. Similarly, in the power amplifier circuit 100, a resistor may be connected in series with the peak short line 128 so that the peak long voltage drop amount and the peak short voltage drop amount are substantially equal to each other.

First, the shapes of the carrier long line 124 and the carrier short line 125 will be described in detail. Next, a resistor connected in series with the carrier short line 125 will be described. Note that since the shapes of the peak long line 127 and the peak short line 128 are the same as those of the carrier long line 124 and the carrier short line 125, description thereof will be omitted.

Figure 3:
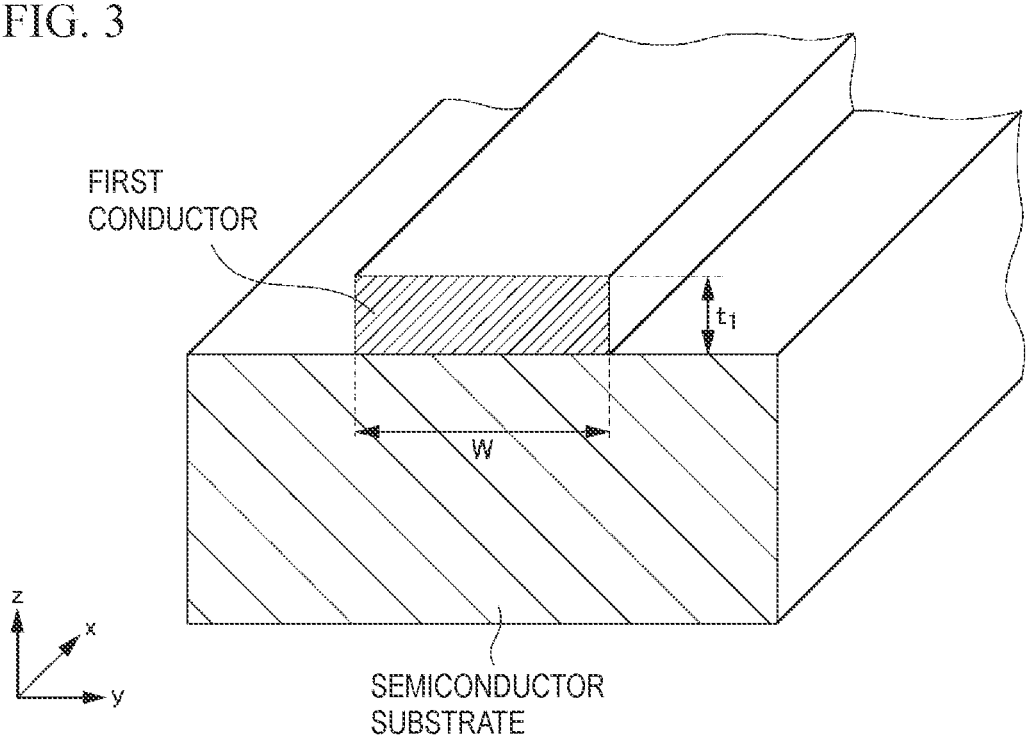
FIG. 3 is a diagram illustrating an example of shapes of a first line and a second line.

The shapes of the carrier long line 124 and the carrier short line 125 will be described with reference to FIG. 3. FIG. 3 is a diagram illustrating an example of the shape of the carrier long line 124 and the carrier short line 125. In FIG. 3, as an example, a line length direction along a surface of a semiconductor substrate on which the carrier long line 124 and the carrier short line 125 are provided is referred to as an "x direction", a line width direction orthogonal to the x direction is referred to as a "y direction", and a line thickness direction orthogonal to the x direction and the y direction is referred to as a "z direction". In the following description, it is assumed that the length Lc1 of the carrier long line 124 is longer than the length Lc2 of the carrier short line 125 as illustrated in FIG. 1 and FIG. 2. Further, in FIG. 3, the length of the line in the y direction is defined as "W", and the length of the line in the z direction is defined as "t1".

As illustrated in FIG. 3, the carrier long line 124 and the carrier short line 125 are formed on the semiconductor substrate by, for example, a first conductor having a predetermined conductivity. The carrier long line 124 has, for example, a cross-sectional area (hereinafter referred to as a long line cross-sectional area) of an yz cross-section orthogonal to the x direction in at least a part of the carrier long line 124. The carrier short line 125 has, for example, a cross-sectional area (hereinafter referred to as a short line cross-sectional area) of an yz cross-section orthogonal to the x direction in at least a part of the carrier short line 125. Each cross-sectional area is represented by the product of the length W of the width and the length t1 of the thickness. That is, the long line cross-sectional area of at least a part of the carrier long line 124 is formed so as to be larger than the short line cross-sectional area of at least a part of the carrier short line 125 so that the carrier long voltage drop amount and the carrier short voltage drop amount are substantially equal to each other. In other words, the carrier long line 124 and the carrier short line 125 are formed such that the resistance value of the carrier long line 124 is substantially equal to the overall resistance value of the carrier short line 125. Here, the case where the one resistance value and the other resistance value are substantially equal to each other includes, for example, a case where a difference between the one resistance value and the other resistance value is within 1Ω. For example, specifically, in the case where the carrier long line 124 and the carrier short line 125 have the same thicknesses (t1), the carrier long line 124 is formed to have the width longer than that of the carrier short line 125.

More specifically, in the carrier long line 124 and the carrier short line 125, the cross section of the carrier long line 124 and the cross section of the carrier short line 125 may be formed such that a first section unit resistance and a second section unit resistance are substantially equal to each other. For example, when the first bias circuit 123 and the second carrier amplifier 118 are connected to each other only by the carrier long line 124, the first section unit resistance is a resistance value per unit length obtained by dividing the resistance value of the carrier long line 124 by the length Lc1 thereof. For example, when the first bias circuit 123 and the first carrier amplifier 115 are connected to each other only by the carrier short line 125, the second section unit resistance is a resistance value per unit length obtained by dividing the resistance value of the carrier short line 125 by the line length thereof. Thus, in the carrier long line 124 and the carrier short line 125, the carrier long voltage drop amount and the carrier short voltage drop amount become substantially equal to each other. Here, the case where the one section unit resistance and the other section unit resistance are substantially equal to each other includes, for example, a case where the difference between the value of the one section unit resistance and the value of the other section unit resistance is within 1Ω.

Figure 4:
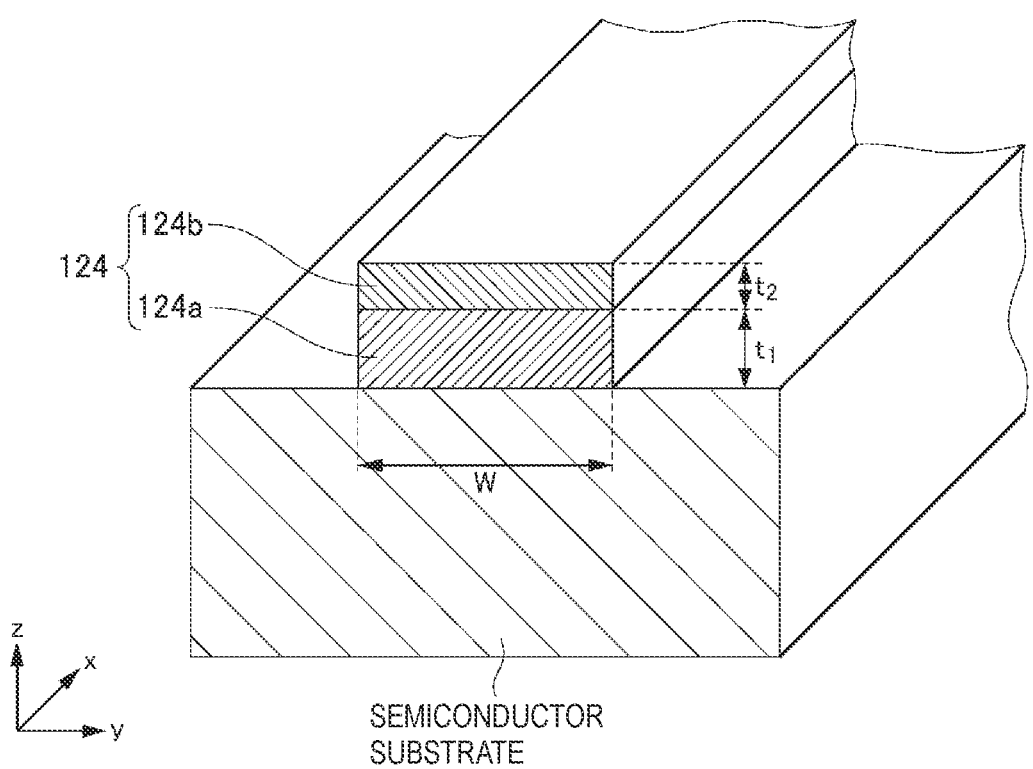
FIG. 4 is a diagram illustrating a first modification of the shape of the first line.

Next, a modification of the shape of the carrier long line 124 will be described with reference to FIG. 4. FIG. 4 is a diagram illustrating a first modification of the shape of the carrier long line 124. FIG. 4 illustrates the x direction, y direction, and z direction as in FIG. 3. As illustrated in FIG. 4, at least a part of the carrier long line 124 is formed of, for example, a first conductor 124a provided on the semiconductor substrate and a second conductor 124b stacked on the first conductor 124a. The first conductor 124a is made of, for example, a first conductive material having a predetermined conductivity. The first conductive material is, for example, copper, gold, aluminum, or the like. The second conductor 124b is made of, for example, a second conductive material having a predetermined conductivity. The second conductive material is, for example, copper, gold, aluminum, or the like, and may be the same conductive material as the first conductive material or may be a conductive material different from the first conductive material. As a result, in the power amplifier circuit 100, for example, in a case where the carrier short line 125 is formed of only the first conductor 124a, since the long line cross-sectional area of the carrier long line 124 is large as compared to the carrier short line 125, the carrier long voltage drop amount can be substantially equal to the carrier short voltage drop amount. In other words, in the power amplifier circuit 100, since the first section unit resistance of the carrier long line 124 and the second section unit resistance of the carrier short line 125 can be made substantially equal to each other, the carrier long voltage drop amount can be made substantially equal to the carrier short voltage drop amount.

Note that in the above description, the carrier long line 124 has a portion formed of two layers of the first conductor 124a and the second conductor 124b, but the present disclosure is not limited thereto. For example, the carrier long line 124 may include, for example, three or more layers of conductors.

Figure 5:
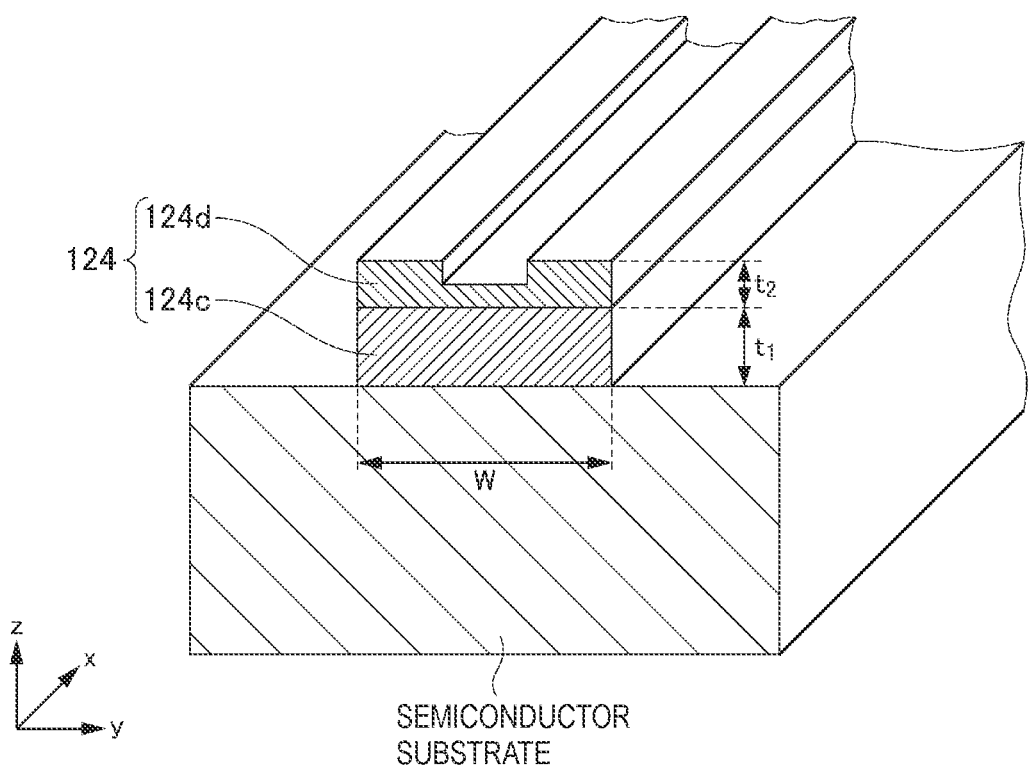
FIG. 5 is a diagram illustrating a second modification of the shape of the first line.

Next, a modification of the shape of the carrier long line 124 will be described with reference to FIG. 5. FIG. 5 is a diagram illustrating a second modification of the shape of the carrier long line 124. FIG. 5 illustrates the x direction, y direction, and z direction as in FIG. 3. As illustrated in FIG. 5, at least a part of the carrier long line 124 is formed of, for example, a first conductor 124c and a second conductor 124d stacked on the first conductor 124c. Since the first conductor 124c is the same as the first conductor 124a of FIG. 4, description thereof will be omitted. Since the conductive material of the second conductor 124d is the same as that of the second conductor 124b of FIG. 4, the description of the conductive material is omitted. As illustrated in FIG. 5, in the second conductor 124d, for example, the thickness in the z direction at an end portion of the carrier long line 124 in the y direction is thicker than the thickness in the z direction at a central portion thereof in the x direction. As a result, in a case where the carrier short line 125 is formed of only the first conductor 124c, for example, since the long line cross-sectional area of the carrier long line 124 is large as compared to the carrier short line 125 in the power amplifier circuit 100, the carrier long voltage drop amount can be substantially equal to the carrier short voltage drop amount. In other words, in the power amplifier circuit 100, since the first section unit resistance of the carrier long line 124 and the second section unit resistance of the carrier short line 125 can be made substantially equal to each other, the carrier long voltage drop amount can be made substantially equal to the carrier short voltage drop amount. More specifically, since the harmonic current flowing through the conductor has a characteristic of intensively flowing through the end portion (outer side portion) of the conductor in the y direction, it is possible to reduce the power loss by increasing the thickness of the end portion in the z direction.

Note that in the above description, the carrier long line 124 may have a portion formed of two layers of the first conductor 124c and the second conductor 124d, but the present disclosure is not limited thereto. For example, the carrier long line 124 may be formed to include, for example, three or more layers of conductors.

Figure 6:
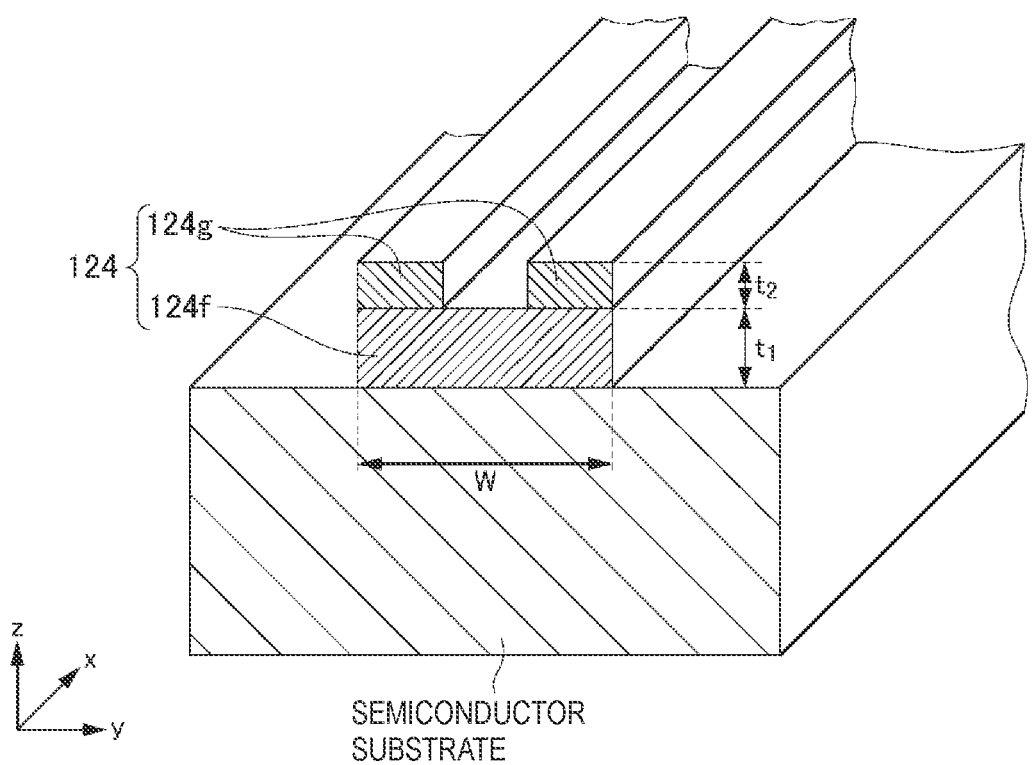
FIG. 6 is a diagram illustrating a third modification of the shape of the first line.

Next, a modification of the shape of the carrier long line 124 will be described with reference to FIG. 6. FIG. 6 is a diagram illustrating a third modification of the shape of the carrier long line 124. FIG. 6 illustrates the x direction, y direction, and z direction as in FIG. 3. As illustrated in FIG. 6, at least a part of the carrier long line 124 is formed of, for example, a first conductor 124f and a second conductor 124g stacked on the first conductor 124f. Since the first conductor 124f is the same as the first conductor 124a of FIG. 4, description thereof will be omitted. Since the conductive material of the second conductor 124g is the same as that of the second conductor 124b of FIG. 4, the description of the conductive material is omitted. As illustrated in FIG. 6, for example, the second conductor 124g is provided along the x direction at least at one end portion of the carrier long line 124 in the y direction. Thus, in a case where the carrier short line 125 is formed of only the first conductor 124f, for example, the power amplifier circuit 100 can make the long line cross-sectional area of the carrier long line 124 large as compared to the short line cross-sectional area of the carrier short line 125, so that the carrier long voltage drop amount can be substantially equal to the carrier short voltage drop amount. In other words, in the power amplifier circuit 100, since the first section unit resistance of the carrier long line 124 and the second section unit resistance of the carrier short line 125 can be made substantially equal to each other, the carrier long voltage drop amount can be made substantially equal to the carrier short voltage drop amount. More specifically, since the harmonic current flowing through the conductor has a characteristic of intensively flowing through the end portion (outer side portion) of the conductor in the y direction, it is possible to reduce power loss by increasing the thickness of the end portion in the z direction.

Note that in the above description, the carrier long line 124 may have a portion formed of two layers of the first conductor 124f and the second conductor 124g, but the present disclosure is not limited thereto. For example, the carrier long line 124 may include, for example, three or more layers of conductors.

Figure 7:
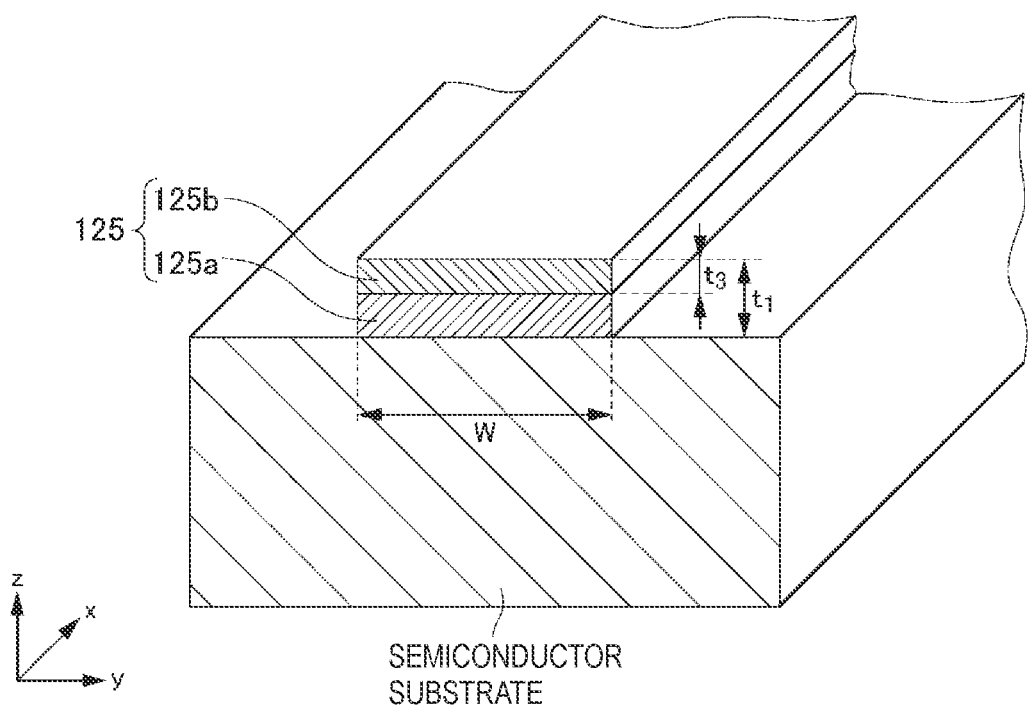
FIG. 7 is a diagram illustrating a first modification of the shape of the second line.

Next, a modification of the shape of the carrier short line 125 will be described with reference to FIG. 7. FIG. 7 is a diagram illustrating a first modification of the shape of the carrier short line 125. FIG. 7 illustrates the x direction, y direction, and z direction as in FIG. 3. As illustrated in FIG. 7, at least a part of the carrier short line 125 is formed of, for example, a third conductor 125a provided on the semiconductor substrate and a fourth conductor 125b stacked on the third conductor 125a. The third conductor 125a is made of, for example, a third conductive material having a predetermined conductivity. The third conductive material is, for example, copper, gold, aluminum, or the like. The fourth conductor 125b is made of, for example, a fourth conductive material having a predetermined conductivity. The fourth conductive material is, for example, copper, gold, aluminum, or the like, and is a conductive material having conductivity lower than the conductivity of the third conductive material. In FIG. 7, for example, the third conductor 125a and the fourth conductor 125b (for example, referred to as thicknesses t3) are formed so as to have thickness of t1. Thus, in a case where the carrier long line 124 is formed of only the first conductor 124a having the thickness t1, for example, the power amplifier circuit 100 can make the second section unit resistance of the carrier short line 125 substantially equal to the first section unit resistance of the carrier long line 124. Therefore, the carrier short voltage drop amount is substantially equal to the carrier long voltage drop amount.

Note that in the above description, the carrier short line 125 may have a portion formed of two layers of the third conductor 125a and the fourth conductor 125b, but the present disclosure is not limited thereto. For example, the carrier short line 125 may be formed to include three or more layers of conductors.

Figure 8:
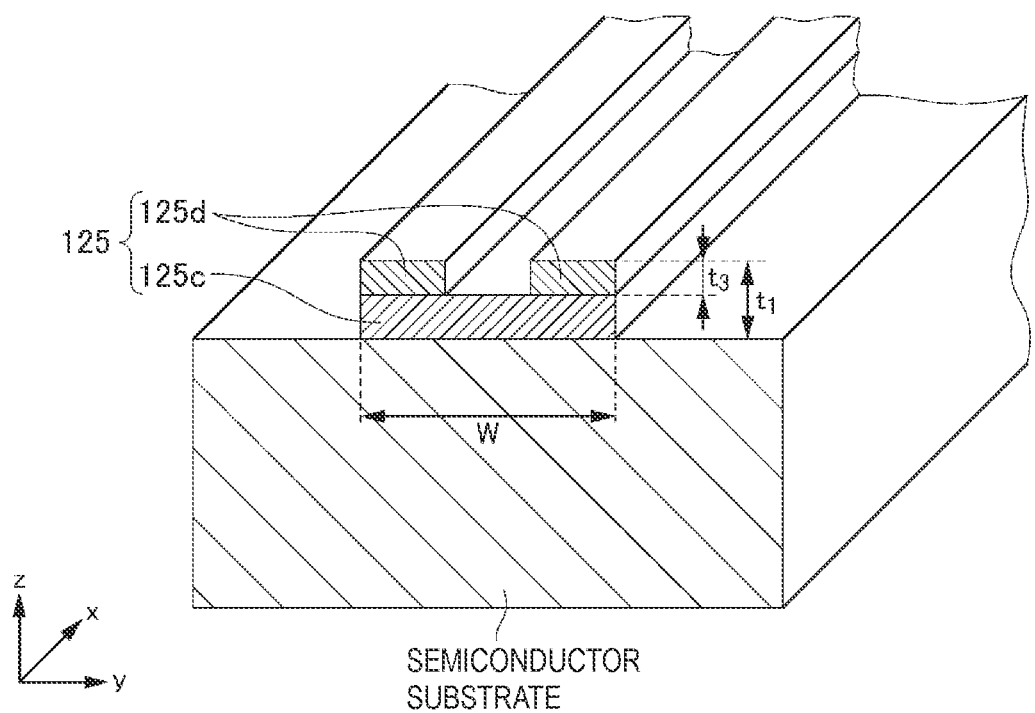
FIG. 8 is a diagram illustrating a second modification of the shape of the second line.

Next, a modification of the shape of the carrier short line 125 will be described with reference to FIG. 8. FIG. 8 is a diagram illustrating a second modification of the shape of the carrier short line 125. FIG. 8 illustrates the x direction, y direction, and z direction as in FIG. 3. As illustrated in FIG. 8, at least a part of the carrier short line 125 is formed of, for example, a third conductor 125c and a fourth conductor 125d stacked on the third conductor 125c. Since the third conductor 125c is the same as the third conductor 125a of FIG. 7, description thereof will be omitted. Since the conductive material of the fourth conductor 125d is the same as that of the fourth conductor 125b of FIG. 7, the description of the conductive material is omitted. As illustrated in FIG. 8, the fourth conductor 125d is provided along the x direction at least at one end portion of the third conductor 125c in the y direction, for example. Thus, in a case where the carrier long line 124 is formed of only the first conductor 124a having the thickness t1, for example, the power amplifier circuit 100 can make the second section unit resistance of the carrier short line 125 substantially equal to the first section unit resistance of the carrier long line 124. Therefore, the carrier short voltage drop amount is substantially equal to the carrier long voltage drop amount. More specifically, since the harmonic current flowing through the conductor has a characteristic of intensively flowing through the end portion (outer side portion) of the conductor in the y direction, it is possible to reduce the power loss by increasing the thickness of the end portion in the z direction.

Note that in the above description, the carrier long line 124 may have a portion formed of two layers of the third conductor 125c and the fourth conductor 125d, but the present disclosure is not limited thereto. For example, the carrier long line 124 may be formed to include, for example, three or more layers of conductors.

Figure 9:
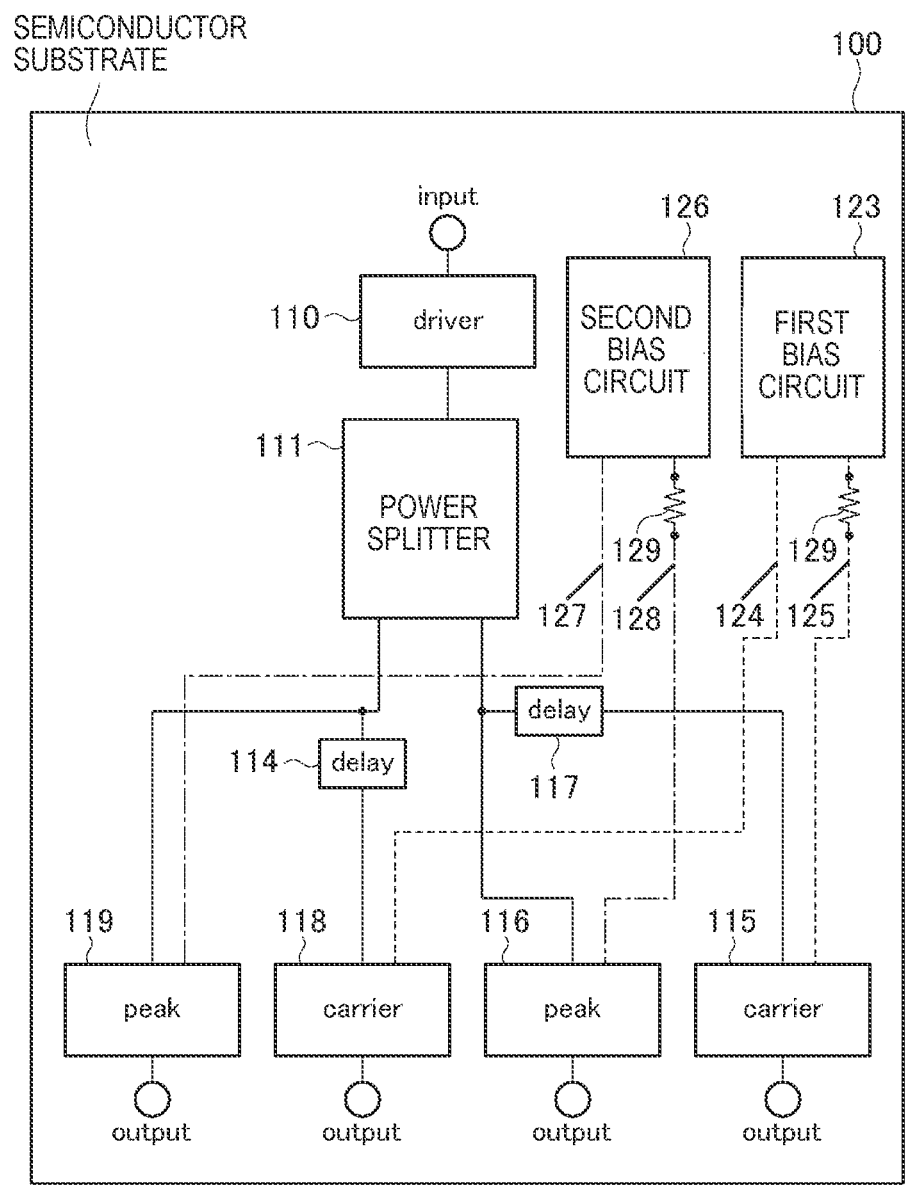
FIG. 9 is a diagram illustrating an arrangement of the power amplifier circuit including a resistor as a component on the semiconductor substrate.

Next, with reference to FIG. 9, a description will be given of a mode in which a resistor 129 is connected in series with the carrier short line 125 in order to make the carrier long voltage drop amount and the carrier short voltage drop amount substantially equal to each other in the power amplifier circuit 100. FIG. 9 is a diagram illustrating an arrangement on the semiconductor substrate of the power amplifier circuit 100 including the resistor 129 as a component. The mode in which the resistor 129 is connected in series with the peak short line 128 in order to make the peak long voltage drop amount and the peak short voltage drop amount substantially equal to each other is the same as the mode in which the resistor is connected in series with the carrier short line 125, and thus the description thereof is omitted.

In the power amplifier circuit 100, for example, the resistor 129 is connected in series with the carrier short line 125 so that the carrier long voltage drop amount and the carrier short voltage drop amount are substantially equal to each other. In other words, when the cross section of the carrier long line 124 and the cross section of the carrier short line 125 are substantially equal to each other, the second section unit resistance can be increased by connecting the resistor to the line having the shorter length. In FIG. 9, by connecting a resistor to the carrier short line 125, the first section unit resistance between the first bias circuit 123 and the second carrier amplifier 118 can be made substantially equal to the second section unit resistance between the first bias circuit 123 and the first carrier amplifier 115.

The resistor 129 connected in series with the carrier short line 125 is provided on the same semiconductor substrate as the other components of the power amplifier circuit 100, for example. As illustrated in FIG. 9, the resistor 129 may be connected to one end portion of the carrier short line 125, may be connected to the other end portion thereof, or may be connected to each of both end portions thereof. More specifically, the resistor 129 may be connected so as to be inserted in the middle of the carrier short line 125, for example.

«Configuration for Reducing size of Power Amplifier Circuit 100»

Figure 10:
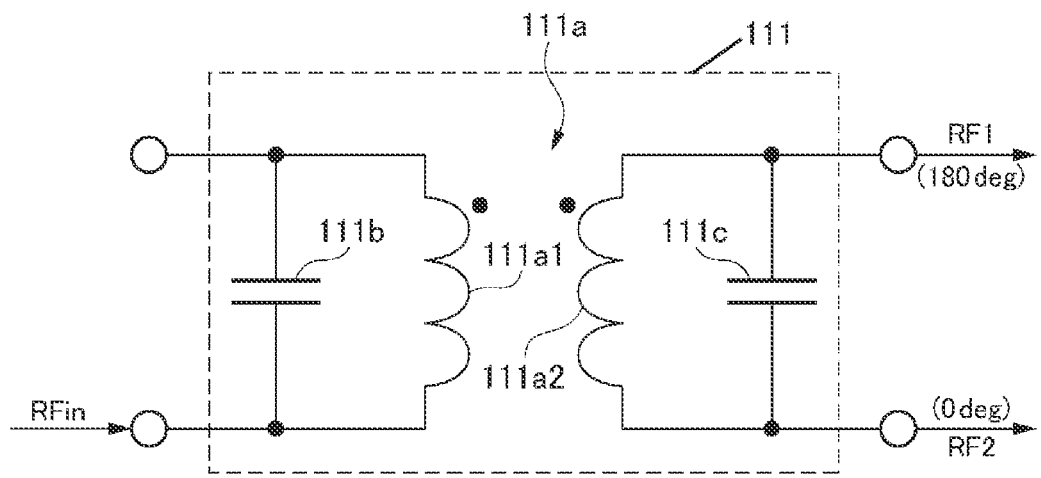
FIG. 10 is a diagram illustrating an example of a configuration of a power splitter.

Next, a configuration for reducing the size of the power amplifier circuit 100 will be described with reference to FIG. 1 and FIG. 10. FIG. 10 is a diagram illustrating an example of a configuration of the power splitter 111.

As illustrated in FIG. 10, the power splitter 111 includes, for example, a transformer 111a, a first capacitor 111b, and a second capacitor 111c. The transformer 111a is, for example, a winding transformer including an input-side winding 111a1 and an output-side winding 111a2 that are magnetic-field-coupled. For example, the transformer 111a propagates a signal input to the input-side winding 111a1 to the output-side winding 111a2. Specifically, in the transformer 111a, the input signal RFin is input to the input-side winding 111a1, and two signals (the signal RF1 and the signal RF2) having opposite phases are output from the output-side winding 111a2. For example, a power supply voltage Vcc is supplied to the input-side winding 111a1 of the transformer 111a. Note that the transformer 111a can also function as impedance matching by adjusting the winding ratio between the input-side winding 111a1 and the output-side winding 111a2. Accordingly, it is not necessary to provide a matching network (for example, the matching network 113), and the impedance can be matched by the transformer 111a formed on the semiconductor substrate. Therefore, the power amplifier circuit 100 can reduce the circuit scale. The first capacitor 111b is connected in parallel with the input-side winding 111a1, for example. The second capacitor 111c is connected in parallel with the output-side winding 111a2, for example. The first capacitor 111b and the second capacitor 111c are provided for impedance matching of the transformer 111a in consideration of, for example, the influence of parasitic inductance of the transformer 111a.

As illustrated in FIG. 1, in the power amplifier circuit 100, the second carrier amplifier 118 and the first peak amplifier 116 constitute a first Doherty amplifier, and the first carrier amplifier 115 and the second peak amplifier 119 constitute a second Doherty amplifier. By generation of two signals whose phases are inverted in the power splitter 111 configured by the above-described balun, each Doherty amplifier can input a signal 90 degrees ahead in phase from the phase of the peak amplifier to the carrier amplifier through the first and second phase shifters 114 and 117 (for example, quarter-wavelength line). That is, the power amplifier circuit 100 configured by the differential Doherty amplifier can be miniaturized by using the balun smaller than the quarter-wavelength line, instead of the quarter-wavelength line.

Figure 11:
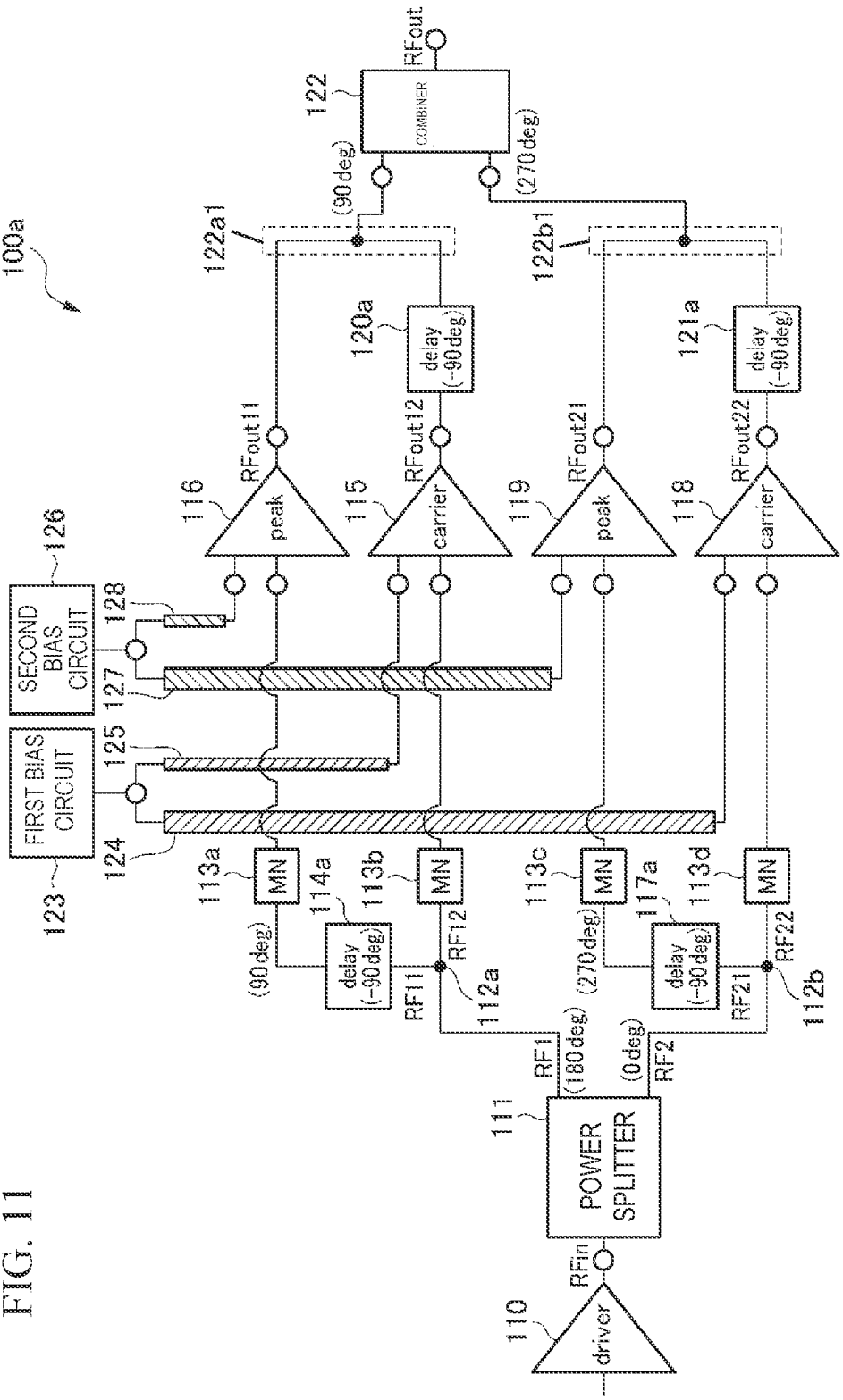
FIG. 11 is a diagram illustrating an example of a power amplifier circuit according to a first modification.

With reference to FIG. 11, a description will be given of a first modification of a configuration for reducing the size of the power amplifier circuit. FIG. 11 is a diagram illustrating an example of a power amplifier circuit 100a according to the first modification. The power amplifier circuit 100a is different from the power amplifier circuit 100 in the connection destinations of a first phase shifter 114a, a second phase shifter 117a, a third phase shifter 120a, and a fourth phase shifter 121a. For example, the first phase shifter 114a is electrically connected between the power splitter 111 and the first peak amplifier 116 and delays phase of the branch signal RF11 by approximately 90 degrees. For example, the second phase shifter 117a is electrically connected between the power splitter 111 and the second peak amplifier 119 and delays phase of the branch signal RF21 by approximately 90 degrees. For example, a signal (phase "90 deg") combined by a combining unit 122a1 that combines the signal RFout11 output from the first peak amplifier 116 and the signal RFout12 output from the first carrier amplifier 115 through the third phase shifter 120a is input to the combiner 122. In addition, for example, a signal (phase "270 deg") combined by a combining unit 122b1 that combines the signal RFout21 output from the second peak amplifier 119 and the signal RFout22 output from the second carrier amplifier 118 through the fourth phase shifter 121a is input to the combiner 122. The combiner 122 combines the two phase-inverted signals and outputs the signal RFout.

Figure 12:
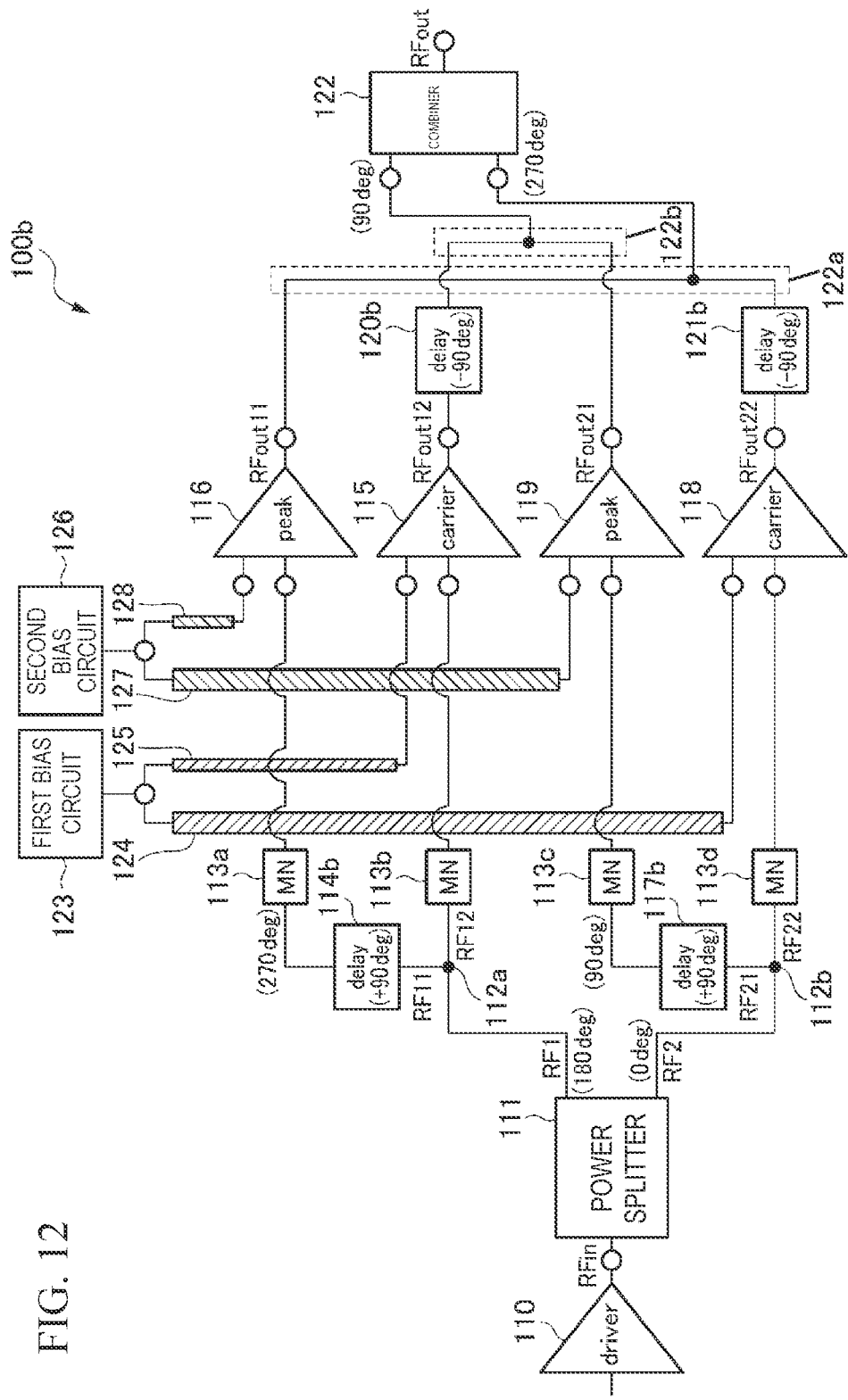
FIG. 12 is a diagram illustrating an example of a power amplifier circuit according to a second modification.

Referring to FIG. 12, a description will be given of a second modification of the configuration for reducing the size of the power amplifier circuit. FIG. 12 is a diagram illustrating an example of a power amplifier circuit 100b according to the second modification. The power amplifier circuit 100b is different from the power amplifier circuit 100 in the connection destinations of a first phase shifter 114b, a second phase shifter 117b, a third phase shifter 120b, and a fourth phase shifter 121b, and phase changes in the first phase shifter 114b and the second phase shifter 117b. For example, the first phase shifter 114b is electrically connected between the power splitter 111 and the first peak amplifier 116 and advances the phase of the branch signal RF11 by approximately 90 degrees. For example, the second phase shifter 117b is electrically connected between the power splitter 111 and the second peak amplifier 119 and advances the phase of the branch signal RF21 by approximately 90 degrees. For example, a signal (phase "270 deg") combined by the combining unit 122a that combines the signal RFout11 output from the first peak amplifier 116 and the signal RFout22 output from the second carrier amplifier 118 through the fourth phase shifter 121b is input to the combiner 122. In addition, for example, a signal (phase "90 deg") combined by the combining unit 122b that combines the signal RFout11 output from the first carrier amplifier 115 through the third phase shifter 120b and the signal RFout22 output from the second peak amplifier 119 is input to the combiner 122. The combiner 122 combines the two phase-inverted signals and outputs the signal RFout. Note that the first phase shifter 114b and the second phase shifter 117b are, for example, a high pass filter including a distributed constant line.

Figure 13:
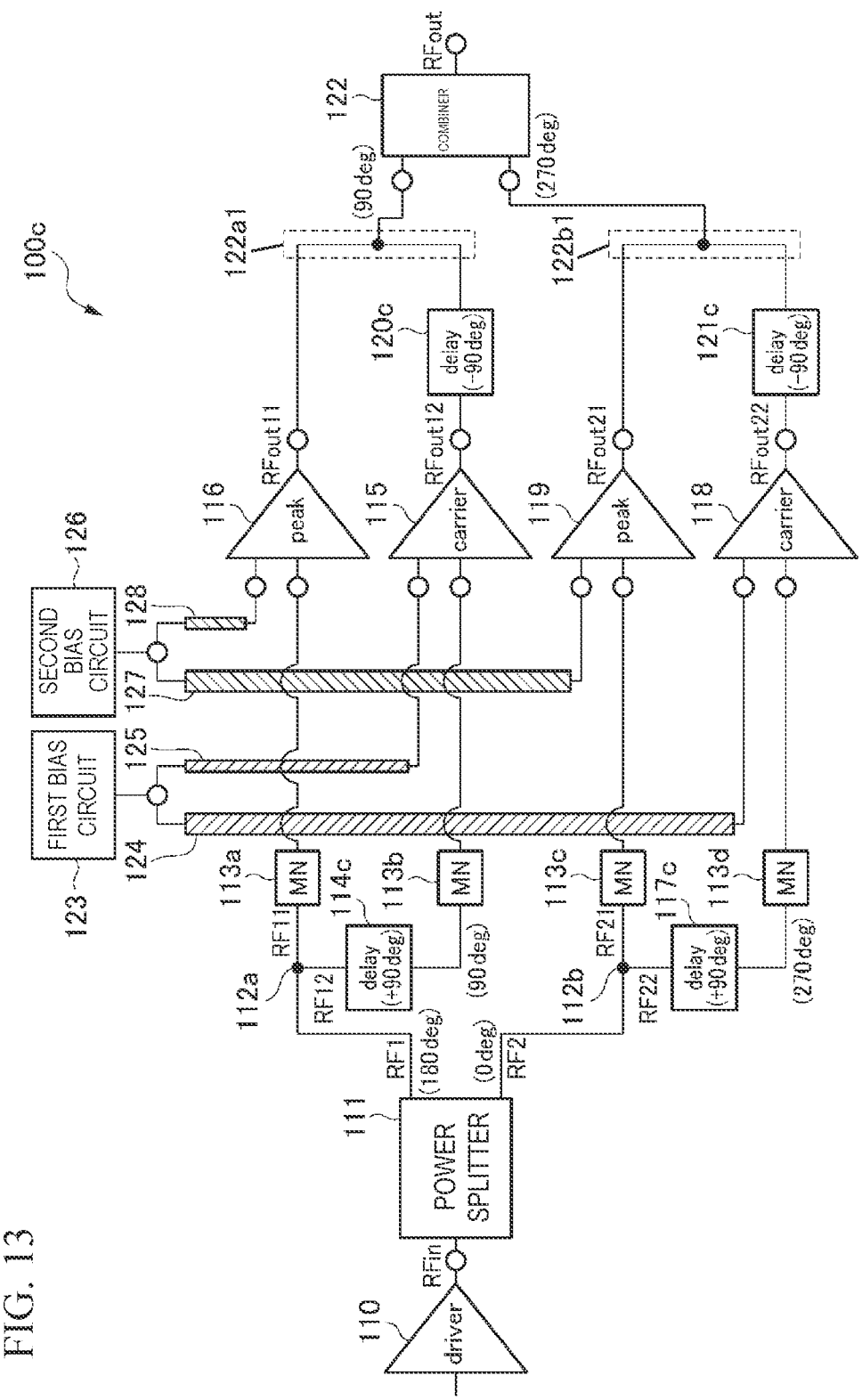
FIG. 13 is a diagram illustrating an example of a power amplifier circuit according to a third modification.

Referring to FIG. 13, a description will be given of a third modification of the configuration for reducing the size of the power amplifier circuit. FIG. 13 is a diagram illustrating an example of a power amplifier circuit 100c according to the third modification. The power amplifier circuit 100c is different from the power amplifier circuit 100a according to the first modification in a first phase shifter 114c and a second phase shifter 117c. For example, the first phase shifter 114c is electrically connected between the power splitter 111 and the first carrier amplifier 115 and advances the phase of the branch signal RF12 by approximately 90 degrees. For example, the second phase shifter 117c is electrically connected between the power splitter 111 and the second carrier amplifier 118 and advances the phase of the branch signal RF22 by approximately 90 degrees. For example, a signal (phase "90 deg") combined by the combining unit 122a1 that combines the signal RFout11 output from the first peak amplifier 116 and the signal RFout12 output from the first carrier amplifier 115 through the third phase shifter 120c is input to the combiner 122. In addition, for example, a signal (phase "270 deg") combined by the combining unit 122b1 that combines the signal RFout21 output from the second peak amplifier 119 and the signal RFout22 output from the second carrier amplifier 118 through the fourth phase shifter 121c is input to the combiner 122. The combiner 122 combines two signals whose phases are inverted and outputs a signal RFout.

CONCLUSION

The power amplifier circuit 100 according to the present embodiment includes the power splitter 111 that splits the input signal RFin into the signal RF2 (first signal) and the signal RF1 (second signal) different in phase from the signal RF2 (first signal), the second carrier amplifier 118 (first amplifier) that amplifies the branch signal RF22 (first branch signal) branched from the signal RF2 (first signal) and outputs the signal RFout22 (first amplified signal), the second peak amplifier 119 (second amplifier) that amplifiers the branch signal RF21 (second branch signal) and outputs the signal RFout21 (second amplified signal) when a power level of the branch signal RF21 (second branch signal) branched from the signal RF2 (first signal) is equal to or higher than a predetermined power level, the first carrier amplifier 115 (third amplifier) that amplifies the branch signal RF12 (third branch signal) branched from the signal RF1 (second signal) and outputs the signal RFout12 (third amplified signal), the first peak amplifier 116 (fourth amplifier) that amplifies the branch signal RF11 (fourth branch signal) and outputs RFout11 (fourth amplified signal) when a power level of the branch signal RF11 (fourth branch signal) branched from the signal RF1 (second signal) is equal to or higher than a predetermined power level, the first bias circuit 123 that outputs a first bias voltage, the carrier long line 124 (first line) having a first length and connecting the first bias circuit 123 and the second carrier amplifier 118 (first amplifier), and the carrier short line 125 (second line) having a second length shorter than the first length and connecting the first bias circuit 123 and the first carrier amplifier 115 (third amplifier), on the same semiconductor substrate, in which the carrier long line 124 (first line) and the carrier short line 125 (second line) are formed such that the voltage drop amount of the first bias voltage between the first bias circuit 123 and the second carrier amplifier 118 (first amplifier) is substantially equal to the voltage drop amount of the first bias voltage between the first bias circuit 123 and the first carrier amplifier 115 (third amplifier). Thus, the efficiency of the power amplifier circuit 100 is improved. In addition, the power up and distortion characteristics of the output power can be improved.

In addition, the power amplifier circuit 100 according to the present embodiment further includes the second bias circuit 126 that outputs a second bias voltage, the peak long line 127 (third line) having a third length and connecting the second bias circuit 126 and the second peak amplifier 119 (second amplifier), and the peak short line 128 (fourth line) having a fourth length shorter than the third length and connecting the second bias circuit 126 and the first peak amplifier 116 (fourth amplifier), on the same semiconductor substrate, in which the peak long line 127 (third line) and the peak short line 128 (fourth line) are formed such that the voltage drop amount of the second bias voltage between the second bias circuit 126 and the second peak amplifier 119 (second amplifier) is substantially equal to the voltage drop amount of the second bias voltage between the second bias circuit 126 and the first peak amplifier 116 (fourth amplifier). Thus, the efficiency of the power amplifier circuit 100 is improved. Furthermore, not only the efficiency is improved, but also the power up and distortion characteristics of the output power can be improved.

Further, in the power amplifier circuit 100 according to the present embodiment, the carrier long line 124 (first line) includes a first portion in which a cross section orthogonal to the length direction of the carrier long line 124 (first line) has a first cross-sectional area, the carrier short line 125 (second line) includes a second portion in which a cross section orthogonal to the length direction of the carrier short line 125 (second line) has a second cross-sectional area, and the first cross-sectional area is larger than the second cross-sectional area. As a result, since the bias points of the two amplifiers in a differential relationship can be matched, the efficiency of the power amplifier circuit 100 is improved.

Further, in the power amplifier circuit 100 according to the present embodiment, the first portion of the carrier long line 124 (first line) is formed of a first number of layers equal to or greater than two, and the second portion of the carrier short line 125 (second line) is formed of a second number of layers smaller than the first number. Accordingly, by appropriately adjusting the resistance of the line, the bias points of the two amplifiers in a differential relationship can be matched, and thus the efficiency of the power amplifier circuit 100 is improved. Furthermore, not only the efficiency is improved, but also the power up and distortion characteristics of the output power can be improved.

Further, in the power amplifier circuit 100 according to the present embodiment, the first portion of the carrier long line 124 (first line) is formed of the first conductor 124c made of a predetermined conductive material and the second conductor 124d made of a predetermined conductive material and stacked on the first conductor 124c, and the second conductor 124d has, at an end portion of the carrier long line 124 (first line) in the y direction (width direction) orthogonal to the x direction (length direction), a portion in which the thickness in the thickness direction orthogonal to the x direction (length direction) and the y direction (width direction) is thicker than the thickness at the central portion of the second conductor 124d in the y direction (width direction). Accordingly, by appropriately adjusting the resistance of the line, the bias points of the two amplifiers in a differential relationship can be matched, and thus the efficiency of the power amplifier circuit 100 is improved. Furthermore, the power loss can be reduced by making the end portion of the second conductor 124d thicker in the z direction.

Further, in the power amplifier circuit 100 according to the present embodiment, the first portion of the carrier long line 124 (first line) is formed of the first conductor 124f made of a predetermined conductive material and the second conductor 124g made of a predetermined conductive material and stacked on the first conductor 124f, and the second conductor 124g is provided along the x direction (length direction) at the end portion of the carrier long line 124 (first line) in the y direction (width direction) orthogonal to the x direction (length direction). Accordingly, by appropriately adjusting the resistance of the line, the bias points of the two amplifiers in a differential relationship can be matched, and thus the efficiency of the power amplifier circuit 100 is improved. Furthermore, the power loss can be reduced by increasing the thickness of the end portion of the carrier long line 124 in the z direction.

In addition, in the power amplifier circuit 100 according to the present embodiment, the first portion of the carrier long line 124 (first line) is formed of a first number of layers equal to or greater than one, and the second portion of the carrier short line 125 (second line) is formed of a second number of layers greater than the first number. Thus, the second section unit resistance of the carrier short line 125 can be made substantially equal to the first section unit resistance of the carrier long line 124. That is, since the carrier short voltage drop amount is substantially equal to the carrier long voltage drop amount, the bias points of the two amplifiers in a differential relationship can be matched.

Further, in the power amplifier circuit 100 according to the present embodiment, the second portion of the carrier short line 125 (second line) is formed of the third conductor 125c made of a predetermined conductive material and the fourth conductor 125d made of a predetermined conductive material and stacked on the third conductor 125c, and the fourth conductor 125d has, at an end portion of the carrier short line 125 (second line) in the y direction (width direction) orthogonal to the x direction (length direction), a portion in which the thickness in the z direction (thickness direction) orthogonal to the x direction (length direction) and the y direction (width direction) is thicker than the thickness at the central portion of the fourth conductor 125d in the y direction (width direction). Accordingly, by appropriately adjusting the resistance of the line, the bias points of the two amplifiers in a differential relationship can be matched, and thus the efficiency of the power amplifier circuit 100 is improved. Furthermore, the power loss can be reduced by making the end portion of the fourth conductor 125d thicker in the z direction.

Further, in the power amplifier circuit 100 according to the present embodiment, the second portion of the carrier short line 125 (second line) is formed of the third conductor 125c made of a predetermined conductive material and the fourth conductor 125d made of a predetermined conductive material and stacked on the third conductor 125c, and the fourth conductor 125d is provided along the x direction (length direction) at the end portion of the carrier short line 125 (second line) in the y direction (width direction) orthogonal to the x direction (length direction). Accordingly, by appropriately adjusting the resistance of the line, the bias points of the two amplifiers in a differential relationship can be matched, and thus the efficiency of the power amplifier circuit 100 is improved. Furthermore, the power loss can be reduced by increasing the thickness of the end portion of the carrier short line 125 in the z direction.

In addition, the power amplifier circuit 100 according to the present embodiment further includes, on the same semiconductor substrate, the resistor 129 connected in series with the carrier short line 125 (second line) between the first bias circuit 123 and the first carrier amplifier 115 (third amplifier) . Thus, the first section unit resistance between the first bias circuit 123 and the second carrier amplifier 118 and the second section unit resistance between the first bias circuit 123 and the first carrier amplifier 115 can be made substantially equal to each other. That is, since the carrier short voltage drop amount is substantially equal to the carrier long voltage drop amount, the bias points of the two amplifiers in a differential relationship can be matched.

Further, in the power amplifier circuit 100 according to the present embodiment, the peak long line 127 (third line) includes a third portion in which a cross section orthogonal to the x direction (length direction) of the peak long line 127 (third line) has a third cross-sectional area, the peak short line 128 (fourth line) includes a portion in which a cross section orthogonal to the x direction (length direction) of the peak short line 128 (fourth line) has a fourth cross-sectional area, and the third cross-sectional area is larger than the fourth cross-sectional area. As a result, since the bias points of the two amplifiers in a differential relationship can be matched, the efficiency of the power amplifier circuit 100 is improved. Furthermore, not only the efficiency is improved, but also the power up and distortion characteristics of the output power can be improved.

Further, in the power amplifier circuit 100 according to the present embodiment, the third portion of the peak long line 127 (third line) is formed by a third number of layers equal to or greater than two, and the fourth portion of the peak short line 128 (fourth line) is formed by a fourth number of layers smaller than the first number. Accordingly, by appropriately adjusting the resistance of the line, the bias points of the two amplifiers in a differential relationship can be matched, and thus the efficiency of the power amplifier circuit 100 is improved. Furthermore, not only the efficiency is improved, but also the power up and distortion characteristics of the output power can be improved.

Further, in the power amplifier circuit 100 according to the present embodiment, the third portion of the peak long line 127 (third line) is formed of the fifth conductor (corresponding to the first conductor 124c) made of a predetermined conductive material and the sixth conductor (corresponding to the second conductor 124d) made of a predetermined conductive material and stacked on the fifth conductor (corresponding to the first conductor 124c), and the sixth conductor (corresponding to the second conductor 124d) has, at an end portion of the peak long line 127 (third line) in the y direction (width direction) orthogonal to the x direction (length direction), a portion in which the thickness in the thickness direction orthogonal to the x direction (length direction) and the y direction (width direction) is thicker than the thickness at the central portion of the sixth conductor (corresponding to the second conductor 124d) in the y direction (width direction). Accordingly, by appropriately adjusting the resistance of the line, the bias points of the two amplifiers in a differential relationship can be matched, and thus the efficiency of the power amplifier circuit 100 is improved. Furthermore, the power loss can be reduced by increasing the thickness of the end portion of the sixth conductor in the z direction.

Further, in the power amplifier circuit 100 according to this embodiment, the third portion of the peak long line 127 (third line) is formed of the fifth conductor (corresponding to the first conductor 124f) made of a predetermined conductive material and the sixth conductor (corresponding to the second conductor 124g) made of a predetermined conductive material and stacked on the fifth conductor (corresponding to the first conductor 124f), and the sixth conductor (corresponding to the second conductor 124g) is provided along the x direction (length direction) at the end portion of the peak long line 127 (third line) in the y direction (width direction) orthogonal to the x direction (length direction). Accordingly, by appropriately adjusting the resistance of the line, the bias points of the two amplifiers in a differential relationship can be matched, and thus the efficiency of the power amplifier circuit 100 is improved. Furthermore, the power loss can be reduced by increasing the thickness of the end portion of the peak long line 127 in the z direction.

In addition, in the power amplifier circuit 100 according to the present embodiment, the third portion of the peak long line 127 (third line) is formed of a third number of layers equal to or greater than one, and the fourth portion of the peak short line 128 (fourth line) is formed of a fourth number of layers greater than the first number. Thus, a fourth section unit resistance of the peak short line 128 can be made substantially equal to a third section unit resistance of the peak long line 127. That is, since the peak short voltage drop amount is substantially equal to the peak long voltage drop amount, the bias points of the two amplifiers in a differential relationship can be matched.

Further, in the power amplifier circuit 100 according to the present embodiment, the fourth portion of the peak short line 128 (fourth line) includes the seventh conductor (corresponding to the third conductor 125c) made of a predetermined conductive material and the eighth conductor (corresponding to the fourth conductor 125d) made of a predetermined conductive material and stacked on the seventh conductor (corresponding to the third conductor 125c), and the eighth conductor (corresponding to the fourth conductor 125d) has, at the end portion of the peak short line 128 (fourth line) in the y direction (width direction) orthogonal to the x direction (length direction), a portion in which the thickness in the thickness direction orthogonal to the x direction (length direction) and the y direction (width direction) is thicker than the thickness at the central portion of the eighth conductor (corresponding to the fourth conductor 125d) in the y direction (width direction). Accordingly, by appropriately adjusting the resistance of the line, the bias points of the two amplifiers in a differential relationship can be matched, and thus the efficiency of the power amplifier circuit 100 is improved. Furthermore, the power loss can be reduced by increasing the thickness of the end portion of the eighth conductor in the z direction.

Further, in the power amplifier circuit 100 according to the present embodiment, the fourth portion of the peak short line 128 (fourth line) is formed of the seventh conductor (corresponding to the third conductor 125c) made of a predetermined conductive material and the eighth conductor (corresponding to the fourth conductor 125d) made of a predetermined conductive material and stacked on the seventh conductor (corresponding to the third conductor 125c), and the eighth conductor (corresponding to the fourth conductor 125d) is provided along the x direction (length direction) at the end portion of the peak short line 128 (fourth line) in the y direction (width direction) orthogonal to the x direction (length direction).

Accordingly, by appropriately adjusting the resistance of the line, the bias points of the two amplifiers in a differential relationship can be matched, and thus the efficiency of the power amplifier circuit 100 is improved. Furthermore, the power loss can be reduced by increasing the thickness of the end portion of the peak short line 128 in the z direction.

In addition, the power amplifier circuit 100 according to the present embodiment further includes, on the same semiconductor substrate, a resistor connected in series with the peak short line 128 (fourth line) between the second bias circuit 126 and the first peak amplifier 116 (fourth amplifier). Thus, the third section unit resistance between the second bias circuit 126 and the second peak amplifier 119 and the fourth section unit resistance between the second bias circuit 126 and the first peak amplifier 116 can be substantially equal to each other. That is, since the peak short voltage drop amount is substantially equal to the peak long voltage drop amount, the bias points of the two amplifiers in a differential relationship can be matched.

In addition, the power amplifier circuit 100 according to the present embodiment further includes the second phase shifters 117 and 117c (phase shifter) that are connected between the power splitter 111 and the second carrier amplifier 118 (first amplifier) and change the phase of the branch signal RF22 (first branch signal), and the first phase shifters 114 and 114c (phase shifter) that are connected between the power splitter 111 and the first carrier amplifier 115 (third amplifier) and change the phase of the branch signal RF12 (third branch signal). As a result, the number of quarter-wavelength lines can be reduced, so that the power amplifier circuit 100 can be miniaturized.

In addition, the power amplifier circuit 100 according to the present embodiment further includes the second phase shifters 117a and 117b (phase shifter) that are connected between the power splitter 111 and the second peak amplifier 119 (second amplifier) and change the phase of the branch signal RF21 (second branch signal), and the first phase shifters 114a and 114b (phase shifter) that are connected between the power splitter 111 and the first peak amplifier 116 (fourth amplifier) and change the phase of the branch signal RF11 (fourth branch signal). As a result, the number of quarter-wavelength lines can be reduced, so that the power amplifier circuit 100 can be miniaturized.

In addition, the power splitter 111 of the power amplifier circuit 100 according to the present embodiment is a balun. As a result, the number of quarter-wavelength lines can be reduced, so that the power amplifier circuit 100 can be miniaturized.

The embodiments described above are intended to facilitate understanding of the present disclosure, and are not intended to limit the present disclosure. The present disclosure may be modified or improved without departing from the spirit thereof, and equivalents thereof are also included in the present disclosure. That is, embodiments obtained by appropriately making design changes to the embodiments by those skilled in the art are also included in the scope of the present disclosure as long as they include the features of the present disclosure. The elements included in the embodiments, the arrangement thereof, and the like are not limited to those illustrated and can be appropriately changed.

REFERENCE SIGNS LIST

100 POWER AMPLIFIER CIRCUIT
111 POWER SPLITTER
114 FIRST PHASE SHIFTER
117 SECOND PHASE SHIFTER
115 FIRST CARRIER AMPLIFIER
116 FIRST PEAK AMPLIFIER
118 SECOND CARRIER AMPLIFIER
119 SECOND PEAK AMPLIFIER

120 THIRD PHASE SHIFTER
121 FOURTH PHASE SHIFTER
122 COMBINER
123 FIRST BIAS CIRCUIT
124 CARRIER LONG LINE
125 CARRIER SHORT LINE
126 SECOND BIAS CIRCUIT
127 PEAK LONG LINE
128 PEAK SHORT LINE

The invention claimed is:

1. A power amplifier circuit comprising:
a power splitter configured to split an input signal into a first signal and a second signal different in phase from the first signal;
a first amplifier configured to amplify a first branch signal branched from the first signal and output a first amplified signal;
a second amplifier configured to amplify, when a power level of a second branch signal branched from the first signal is equal to or higher than a first predetermined power level, the second branch signal and output a second amplified signal;
a third amplifier configured to amplify a third branch signal branched from the second signal and output a third amplified signal;
a fourth amplifier configured to amplify, when a power level of a fourth branch signal branched from the second signal is equal to or higher than a second predetermined power level, the fourth branch signal and output a fourth amplified signal;
a first bias circuit configured to output a first bias voltage;
a first line comprising a first length and connecting the first bias circuit and the first amplifier;
a second line comprising a second length shorter than the first length and connecting the first bias circuit and the third amplifier; and
a semiconductor substrate,
wherein the first line and the second line are on the semiconductor substrate such that a voltage drop amount of the first bias voltage between the first bias circuit and the first amplifier is substantially equal to a voltage drop amount of the first bias voltage between the first bias circuit and the third amplifier.

2. The power amplifier circuit according to claim 1, further comprising:
a second bias circuit configured to output a second bias voltage;
a third line comprising a third length and connecting the second bias circuit and the second amplifier; and
a fourth line comprising a fourth length shorter than the third length and connecting the second bias circuit and the fourth amplifier,
wherein the third line and the fourth line are on the semiconductor substrate such that a voltage drop amount of the second bias voltage between the second bias circuit and the second amplifier is substantially equal to a voltage drop amount of the second bias voltage between the second bias circuit and the fourth amplifier.

3. The power amplifier circuit according to claim 1,
wherein the first line comprises a first portion in which a cross section orthogonal to a length direction of the first line comprises a first cross-sectional area,
the second line comprises a second portion in which a cross section orthogonal to a length direction of the second line comprises a second cross-sectional area, and
the first cross-sectional area is larger than the second cross-sectional area.

4. A power amplifier circuit comprising:
a power splitter configured to split an input signal into a first signal and a second signal different in phase from the first signal;
a first amplifier configured to amplify a first branch signal branched from the first signal and output a first amplified signal;
a second amplifier configured to amplify, when a power level of a second branch signal branched from the first signal is equal to or higher than a first predetermined power level, the second branch signal and output a second amplified signal;
a third amplifier configured to amplify a third branch signal branched from the second signal and output a third amplified signal;
a fourth amplifier configured to amplify, when a power level of a fourth branch signal branched from the second signal is equal to or higher than a second predetermined power level, the fourth branch signal and output a fourth amplified signal;
a first bias circuit configured to output a first bias voltage;
a first line comprising a first length and connecting the first bias circuit and the first amplifier;
a second line comprising a second length shorter than the first length and connecting the first bias circuit and the third amplifier; and
a semiconductor substrate,
wherein the first line and the second line are on the semiconductor substrate,
wherein the first line comprises a first portion in which a cross section orthogonal to a length direction of the first line comprises a first cross-sectional area,
the second line comprises a second portion in which a cross section orthogonal to a length direction of the second line comprises a second cross-sectional area, and
the first cross-sectional area is larger than the second cross-sectional area.

5. The power amplifier circuit according to claim 4, further comprising:
a second bias circuit configured to output a second bias voltage;
a third line comprising a third length and connecting the second bias circuit and the second amplifier; and
a fourth line comprising a fourth length shorter than the third length and connecting the second bias circuit and the fourth amplifier,
wherein the third line and the fourth line are on the semiconductor substrate such that a voltage drop amount of the second bias voltage between the second bias circuit and the second amplifier is substantially equal to a voltage drop amount of the second bias voltage between the second bias circuit and the fourth amplifier.

6. The power amplifier circuit according to claim 3,
wherein the first portion of the first line comprises a first number of layers equal to or greater than two, and
the second portion of the second line comprises a second number of layers smaller than the first number.

7. The power amplifier circuit according to claim 6,
wherein the first portion of the first line comprises a first conductor that comprises a first predetermined conductive material and a second conductor that comprises a second predetermined conductive material and is stacked on the first conductor, and the second conductor comprises, at an end portion of the first line in a width direction orthogonal to the length direction, a portion in which a thickness in a thickness direction orthogonal to the length direction and the width direction is thicker than a thickness at a central portion of the second conductor in the width direction.

8. The power amplifier circuit according to claim 6, wherein the first portion of the first line comprises a first conductor that comprises a first predetermined conductive material and a second conductor that comprises a second predetermined conductive material and is stacked on the first conductor, and the second conductor is located at an end portion of the first line in a width direction orthogonal to the length direction.

9. The power amplifier circuit according to claim 3, wherein the first portion of the first line comprises a first number of layers equal to or greater than one, the second portion of the second line comprises a second number of layers greater than the first number.

10. The power amplifier circuit according to claim 9, wherein the second portion of the second line comprises a third conductor that comprises a first predetermined conductive material and a fourth conductor that comprises a second predetermined conductive material and is stacked on the third conductor, and the fourth conductor comprises, at an end portion of the second line in a width direction orthogonal to the length direction, a portion in which a thickness in a thickness direction orthogonal to the length direction and the width direction is thicker than a thickness at a central portion of the fourth conductor in the width direction.

11. The power amplifier circuit according to claim 9, wherein the second portion of the second line comprises a third conductor that comprises a first predetermined conductive material and a fourth conductor that comprises a second predetermined conductive material and is stacked on the third conductor, and the fourth conductor is located at an end portion of the second line in a width direction orthogonal to the length direction.

12. The power amplifier circuit according to claim 1, further comprising a resistor on the semiconductor substrate, the resistor connected in series with the second line between the first bias circuit and the third amplifier.

13. The power amplifier circuit according to claim 2, wherein the third line comprises a third portion in which a cross section orthogonal to a length direction of the third line comprises a third cross-sectional area, and the fourth line comprises a fourth portion in which a cross section orthogonal to the length direction of the fourth line comprises a fourth cross-sectional area, and the third cross-sectional area is larger than the fourth cross-sectional area.

14. The power amplifier circuit according to claim 13, wherein the third portion of the third line comprises a third number of layers equal to or greater than two, and the fourth portion of the fourth line comprises a fourth number of layers smaller than the third number.

15. The power amplifier circuit according to claim 14, wherein the third portion of the third line comprises a fifth conductor that comprises a first predetermined conductive material and a sixth conductor that comprises a second predetermined conductive material and is stacked on the fifth conductor, and the sixth conductor comprises, at an end portion of the third line in a width direction orthogonal to the length direction, a portion in which a thickness in a thickness direction orthogonal to the length direction and the width direction is thicker than a thickness at a central portion of the sixth conductor in the width direction.

16. The power amplifier circuit according to claim 14, wherein the third portion of the third line comprises a fifth conductor that comprises a first predetermined conductive material and a sixth conductor that comprises a second predetermined conductive material and is stacked on the fifth conductor, and the sixth conductor is located at an end portion of the third line in a width direction orthogonal to the length direction.

17. The power amplifier circuit according to claim 13, wherein the third portion of the third line comprises a third number of layers equal to or greater than one, and the fourth portion of the fourth line comprises a fourth number of layers greater than the third number.

18. The power amplifier circuit according to claim 17, wherein the fourth portion of the fourth line comprises a seventh conductor that comprises a first predetermined conductive material and an eighth conductor that comprises a second predetermined conductive material and is stacked on the seventh conductor, and the eighth conductor comprises, at an end portion of the fourth line in a width direction orthogonal to the length direction, a portion in which a thickness in a thickness direction orthogonal to the length direction and the width direction is thicker than a thickness at a central portion of the eighth conductor in the width direction.

19. The power amplifier circuit according to claim 17, wherein the fourth portion of the fourth line comprises a seventh conductor that comprises a first predetermined conductive material and an eighth conductor that comprises a second predetermined conductive material and is stacked on the seventh conductor, and the eighth conductor is located at an end portion of the fourth line in a width direction orthogonal to the length direction.

20. The power amplifier circuit according to claim 13, further comprising a resistor on the semiconductor substrate, the resistor connected in series with the fourth line between the second bias circuit and the fourth amplifier.

* * * * *